United States Patent
Chen et al.

(10) Patent No.: US 10,026,592 B2
(45) Date of Patent: Jul. 17, 2018

(54) SYSTEMS AND METHODS FOR TAILORING ION ENERGY DISTRIBUTION FUNCTION BY ODD HARMONIC MIXING

(71) Applicant: Lam Research Corporation, Fremont, CA (US)

(72) Inventors: Zhigang Chen, Campbell, CA (US); Alexei Marakhtanov, Albany, CA (US); John Patrick Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1 day.

(21) Appl. No.: 15/201,190

(22) Filed: Jul. 1, 2016

(65) Prior Publication Data

US 2018/0005802 A1    Jan. 4, 2018

(51) Int. Cl.
*H01J 37/32* (2006.01)

(52) U.S. Cl.
CPC .. *H01J 37/32146* (2013.01); *H01J 37/32165* (2013.01); *H01J 37/32183* (2013.01); *H01J 2237/327* (2013.01)

(58) Field of Classification Search
None
See application file for complete search history.

(56) References Cited

U.S. PATENT DOCUMENTS

| | | | |
|---|---|---|---|
| 2,484,763 A * | 10/1949 | Sturm | H03B 19/10 327/105 |
| 3,621,273 A | 11/1971 | Rorden et al. | |
| 3,943,407 A | 3/1976 | Bolasny | |
| 4,057,462 A | 11/1977 | Jassby et al. | |
| 5,073,725 A | 12/1991 | Takano et al. | |
| 5,274,659 A | 12/1993 | Harvey et al. | |
| 5,274,727 A * | 12/1993 | Ito | G02F 1/3775 359/332 |
| 5,576,629 A | 11/1996 | Turner et al. | |
| 6,204,957 B1 | 3/2001 | Yoshino et al. | |
| 6,326,794 B1 | 12/2001 | Lundquist et al. | |
| 7,016,389 B2 | 3/2006 | Dudley et al. | |
| 7,084,369 B2 * | 8/2006 | Sosnowski | H01J 37/32082 156/345.24 |
| 7,695,983 B2 | 4/2010 | Hoffman | |
| 7,728,602 B2 * | 6/2010 | Valcore | H01J 37/32082 324/464 |
| 7,759,641 B2 | 7/2010 | Hasegawa et al. | |

(Continued)

FOREIGN PATENT DOCUMENTS

| | | |
|---|---|---|
| EP | 0 817 239 A1 | 1/1998 |
| EP | 0 957 395 A2 | 11/1999 |

(Continued)

*Primary Examiner* — Douglas W Owens
*Assistant Examiner* — Srinivas Sathiraju
(74) *Attorney, Agent, or Firm* — Martine Penilla Group, LLP

(57) ABSTRACT

Systems and methods for controlling a process applied to a substrate within a plasma chamber are described. The systems and methods include generating and supplying odd harmonic signals and summing the odd harmonic signals to generate an added signal. The added signal is supplied to an electrode within the plasma chamber for processing the substrate. The use of odd harmonic signals facilitates high aspect ratio etching of the substrate.

20 Claims, 10 Drawing Sheets

(56) References Cited

U.S. PATENT DOCUMENTS

| | | | |
|---|---|---|---|
| 7,811,410 B2* | 10/2010 | Leming | H03B 21/00 118/723 E |
| 7,813,016 B2 | 10/2010 | Pu et al. | |
| 7,989,758 B2 | 8/2011 | Koster | |
| 8,208,505 B2 | 6/2012 | Dantus et al. | |
| 8,384,019 B2 | 2/2013 | Koster et al. | |
| 8,395,112 B1* | 3/2013 | Bier | G01N 21/53 250/281 |
| 8,466,427 B2* | 6/2013 | Moiseyev | B82Y 20/00 250/393 |
| 8,503,070 B1* | 8/2013 | Henry | H01S 3/2383 359/337 |
| 8,642,948 B2 | 2/2014 | Makarov et al. | |
| 8,704,173 B2* | 4/2014 | Nikolaev | H01J 49/38 250/290 |
| 8,847,159 B2 | 9/2014 | Chen et al. | |
| 8,890,537 B2 | 11/2014 | Valcore, Jr. et al. | |
| 8,907,271 B2 | 12/2014 | Koster | |
| 8,933,629 B2 | 1/2015 | Heil et al. | |
| 8,946,623 B2 | 2/2015 | Koster et al. | |
| 8,980,760 B2* | 3/2015 | Agarwal | H01J 37/32082 156/345.48 |
| 9,087,677 B2 | 7/2015 | Funk et al. | |
| 9,095,367 B2 | 8/2015 | Olson et al. | |
| 9,107,284 B2* | 8/2015 | Albarede | H01J 37/32183 |
| 9,312,889 B2* | 4/2016 | Li | H04B 1/04 |
| 9,333,034 B2* | 5/2016 | Hancock | A61B 18/042 |
| 9,460,894 B2* | 10/2016 | Lill | H01J 37/32146 |
| 9,644,271 B1* | 5/2017 | Keil | C23C 16/505 |
| 9,721,759 B1* | 8/2017 | Karlquist | H01J 37/32183 |
| 2002/0123237 A1 | 9/2002 | Nguyen et al. | |
| 2004/0134614 A1* | 7/2004 | Jevtic | H01J 37/32082 156/345.43 |
| 2004/0146076 A1 | 7/2004 | Dudley et al. | |
| 2006/0043063 A1 | 3/2006 | Mahoney et al. | |
| 2008/0219917 A1 | 9/2008 | Koruga | |
| 2009/0067018 A1 | 3/2009 | Pu et al. | |
| 2010/0247403 A1* | 9/2010 | Hancock | A61L 2/14 422/186.29 |
| 2010/0301204 A1* | 12/2010 | Koster | H01J 49/425 250/283 |
| 2011/0163227 A1 | 7/2011 | Makarov et al. | |
| 2011/0248634 A1* | 10/2011 | Heil | H01J 37/32009 315/111.41 |
| 2013/0122711 A1* | 5/2013 | Marakhtanov | H01J 37/32091 438/711 |
| 2013/0146761 A1 | 6/2013 | Koster et al. | |
| 2014/0076713 A1* | 3/2014 | Valcore, Jr. | H01J 37/32165 204/164 |
| 2014/0114334 A1 | 4/2014 | Olson et al. | |
| 2014/0305589 A1* | 10/2014 | Valcore, Jr. | H01J 37/32146 156/345.24 |
| 2015/0002018 A1* | 1/2015 | Lill | H01J 37/32146 315/111.21 |
| 2015/0084509 A1* | 3/2015 | Yuzurihara | H01J 37/32082 315/111.21 |
| 2016/0071701 A1* | 3/2016 | Lane | H01J 37/32623 156/345.28 |
| 2017/0062186 A1* | 3/2017 | Coumou | H01J 37/32155 |
| 2017/0330744 A1* | 11/2017 | Keil | H01L 21/02274 |

FOREIGN PATENT DOCUMENTS

| | | |
|---|---|---|
| EP | 0 962 809 A2 | 12/1999 |
| EP | 0 890 189 B1 | 2/2003 |
| EP | 2 249 372 A1 | 11/2010 |
| WO | WO 83 02700 | 8/1983 |
| WO | WO 94 18683 | 8/1994 |
| WO | WO 2011 045144 A1 | 4/2011 |

* cited by examiner

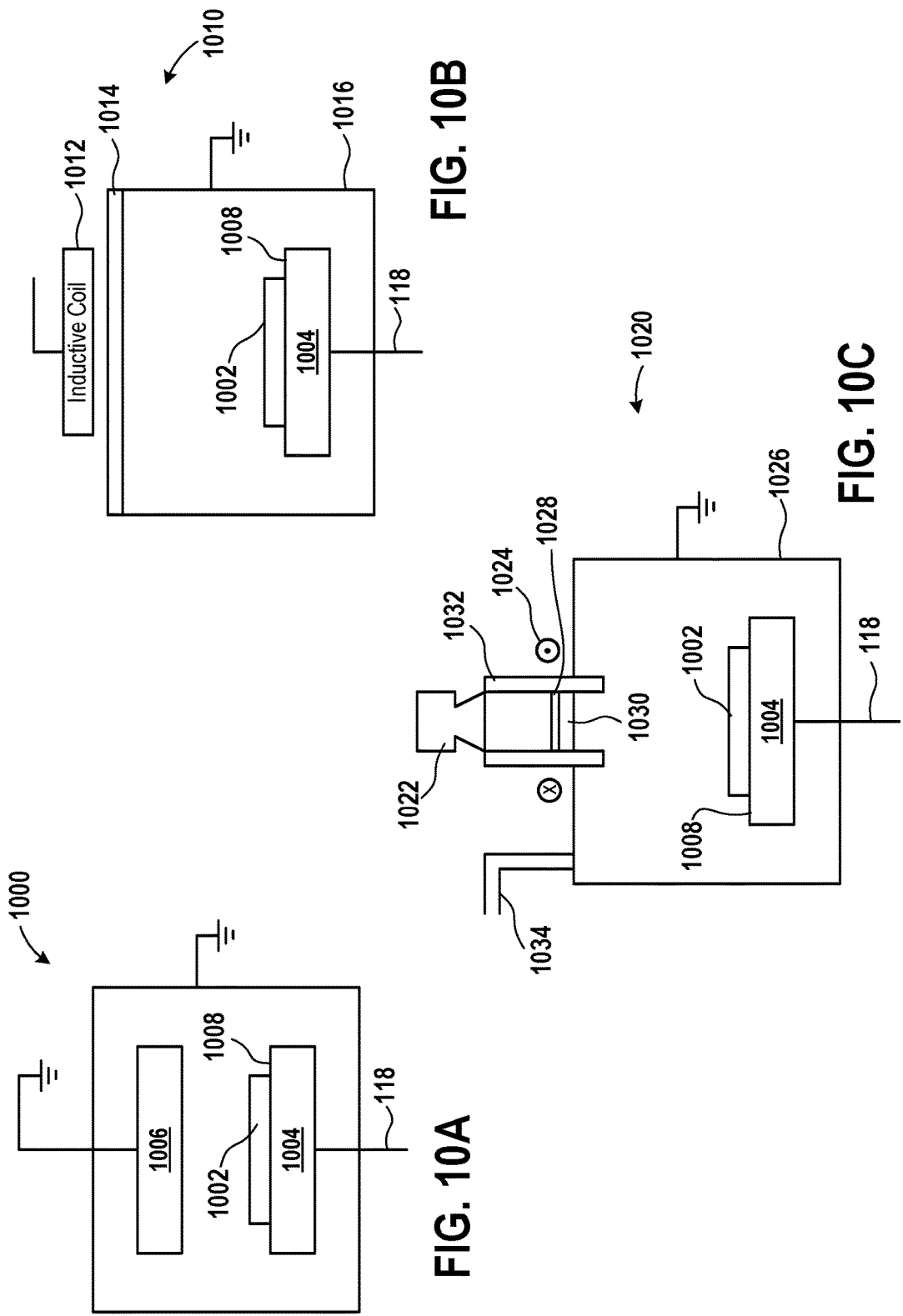

SYSTEMS AND METHODS FOR TAILORING ION ENERGY DISTRIBUTION FUNCTION BY ODD HARMONIC MIXING

FIELD

The present embodiments relate to systems and methods for tailoring ion energy distribution function by odd harmonic mixing.

BACKGROUND

A plasma system includes one or more radio frequency (RF) generators, an impedance matching network, and a plasma chamber. The plasma chamber includes an electrode at a top portion of the plasma chamber and another electrode at a bottom portion of the plasma chamber. The electrode at the top portion has multiple gas inlets for allowing passage of a gas into the plasma chamber.

A wafer is placed on top of the electrode at the bottom portion for processing the wafer. The one or more RF generators are turned on to supply RF signals, which are transferred via the impedance matching network to the plasma chamber. In addition, the gas is supplied via the gas inlets to the plasma chamber. The gas is ignited by the RF signals to generate plasma within the plasma chamber and the plasma is used to process the wafer. During processing the wafer, a variety of controls are implemented to control processing of the wafer.

It is in this context that embodiments described in the present disclosure arise.

SUMMARY

Embodiments of the disclosure provide apparatus, methods and computer programs for tailoring ion energy distribution function by odd harmonic mixing. It should be appreciated that the present embodiments can be implemented in numerous ways, e.g., a process, an apparatus, a system, a piece of hardware, or a method on a computer-readable medium. Several embodiments are described below.

In some embodiments, a system and method for tailoring ion energy distribution function (IEDF) for plasma processing, specifically for high aspect ratio etching, is provided. The IEDF is usually determined by individual RF power sources at distinct frequencies, e.g., 2 megahertz (MHz) or 400 kilohertz (kHz) for bias frequency and 27 MHz or 60 MHz for source frequency, etc., in capacitively coupled plasmas. The method, described herein, in various embodiments, involves mixing a number of odd harmonics of the bias frequency after modifying an amplitude and/or a phase of one or more of the odd harmonics to increase peak ion energy and/or ion flux at a peak ion energy. Such increase in the peak ion energy and/or ion flux is highly desired for a high aspect ratio etch at a bottom of a feature of a substrate. Mixing the odd harmonics enables RF waveform manipulation, which in turn enables tailoring of the IEDF to achieve an optimal etch process performance.

In some embodiments, a system is described. The system includes an RF generator and a plasma chamber coupled to the RF generator. The RF generator includes an odd harmonic power supply that generates an $n^{th}$ odd harmonic RF signal. The RF generator includes an impedance matching circuit coupled to the odd harmonic power supply. The impedance matching circuit outputs an $n^{th}$ modified odd harmonic RF signal upon receiving the $n^{th}$ odd harmonic RF signal. The RF generator further includes a frequency multiplier coupled to the impedance matching circuit. The frequency multiplier receives the $n^{th}$ modified odd harmonic RF signal to output an $(n+2)^{th}$ odd harmonic RF signal. The RF generator also includes a variable adjuster coupled to the frequency multiplier. The variable adjuster modifies a variable of the $(n+2)^{th}$ odd harmonic RF signal to output an adjusted $(n+2)^{th}$ odd harmonic RF signal. The RF generator includes an adder coupled to the variable adjuster and the impedance matching circuit. The adder adds the $n^{th}$ modified odd harmonic RF signal and the adjusted $(n+2)^{th}$ odd harmonic RF signal to provide an added RF signal. The plasma chamber receives the added RF signal from the adder to provide power to an electrode within the plasma chamber.

In various embodiments, another system is described. The system includes an RF generator and a plasma chamber coupled to the RF generator. The RF generator includes a first odd harmonic RF power supply that generates an $n^{th}$ odd harmonic RF signal and a second odd harmonic RF power supply that generates an $(n+2)^{th}$ odd harmonic RF signal. The RF generator further includes a first impedance matching circuit coupled to the first odd harmonic RF power supply. The first impedance matching circuit receives the $n^{th}$ odd harmonic RF signal to output an $n^{th}$ modified odd harmonic RF signal. The RF generator also includes a second impedance matching circuit coupled to the second odd harmonic RF power supply. The second impedance matching circuit receives the $(n+2)^{th}$ odd harmonic RF signal to output an $(n+2)^{th}$ modified odd harmonic RF signal. The RF generator includes an adder coupled to the first impedance matching circuit and the second impedance matching circuit. The adder adds the $n^{th}$ modified odd harmonic RF signal and the $(n+2)^{th}$ modified odd harmonic RF signal to output an added RF signal. The plasma chamber receives the added RF signal from the adder for changing an impedance of plasma within the plasma chamber.

In various embodiments, yet another system is described. The system includes an RF generator and a plasma chamber coupled to the RF generator. The RF generator includes a first odd harmonic RF power supply that generates an $n^{th}$ odd harmonic RF signal and a second odd harmonic RF power supply that generates an $(n+2)^{th}$ odd harmonic RF signal. The RF generator further includes a variable adjuster coupled to the second odd harmonic RF power supply. The variable adjuster adjusts a variable of the $(n+2)^{th}$ odd harmonic RF signal to output an adjusted $(n+2)^{th}$ odd harmonic RF signal. The RF generator also includes a first impedance matching circuit coupled to the first odd harmonic RF power supply. The first impedance matching circuit receives the $n^{th}$ odd harmonic RF signal for outputting an $n^{th}$ modified odd harmonic RF signal. The RF generator further includes a second impedance matching circuit coupled to the variable adjuster. The second impedance matching circuit receives the adjusted $(n+2)^{th}$ odd harmonic RF signal to output an $(n+2)^{th}$ modified odd harmonic RF signal. The RF generator includes an adder coupled to the first impedance matching circuit and the second impedance matching circuit. The adder adds the $n^{th}$ modified odd harmonic RF signal with the $(n+2)^{th}$ modified odd harmonic RF signal to output an added RF signal. The plasma chamber receives the added RF signal to modify an impedance of plasma within the plasma chamber.

Some advantages of the herein described systems and methods include controlling the ion energy and/or the ion flux by controlling a phase and/or amplitude of odd harmonics of an RF signal that is generated by an RF generator and/or by mixing the odd harmonics. The control of the phase and/or amplitude of the odd harmonics and/or the mixing to increase the ion flux and/or ion energy helps increase an etch rate of etching features of a wafer to achieve a high aspect ratio etch. In some embodiments, such high aspect ratio etch is not achieved by using even harmonics. To the contrary, mixing of the even harmonics reduces the ion flux.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 10A is a diagram of an embodiment of a capacitively coupled plasma (CCP) chamber, which is an example of the plasma chamber of FIG. 1.

FIG. 10B is a diagram of an embodiment of an inductively coupled plasma (ICP) chamber, which is another example of the plasma chamber of FIG. 1.

FIG. 10C is a diagram of an embodiment of an electron cyclotron resonance (ECR) plasma chamber, which is yet another example of the plasma chamber of FIG. 1.

DETAILED DESCRIPTION

The following embodiments describe systems and methods for tailoring ion energy distribution function by odd harmonic mixing. It will be apparent that the present embodiments may be practiced without some or all of these specific details. In other instances, well known process operations have not been described in detail in order not to unnecessarily obscure the present embodiments.

Figure 1:
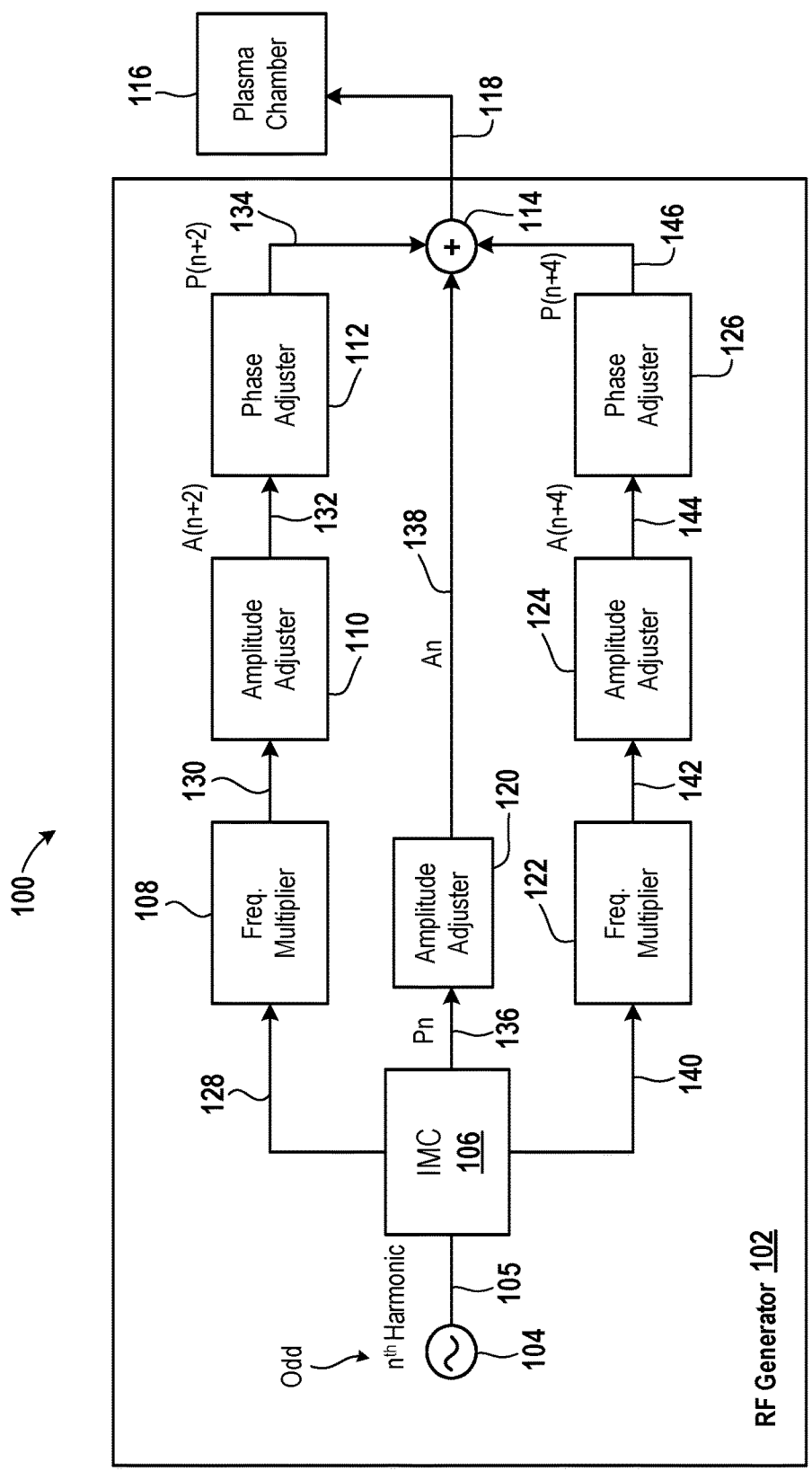
FIG. 1 is a diagram of an embodiment of a plasma system to illustrate providing a combination of odd harmonic signals to a plasma chamber.

FIG. 1 is a diagram of an embodiment of a plasma system 100 to illustrate providing a combination of odd harmonic signals to a plasma chamber 116. The plasma system 100 includes a radio frequency (RF) generator 102. The RF generator 102 includes an RF power supply 104, e.g., an RF oscillator, etc., an impedance matching circuit (IMC) 106, a frequency multiplier 108, an amplitude adjuster 110, a phase adjuster 112, another amplitude adjuster 120, a frequency multiplier 122, an amplitude adjuster 124, a phase adjuster 126, and an adder 114. The RF power supply 104 is coupled to the IMC 106 via an RF cable 105. In various embodiments, the RF power supply 104 has a fundamental frequency of 400 kilohertz (kHz) or 2 megahertz (MHz). In some embodiments, the RF power supply 104 has a fundamental frequency of 27 MHz or 60 MHz.

In some embodiments, an IMC includes one or more capacitors, or one or more inductors, a combination of the one or more inductors and the one or more capacitors. An example of an amplitude adjuster includes an amplifier, e.g., an RF amplifier, etc. An example of a phase adjuster includes a circuit that includes multiple resistors and multiple variable capacitors, a circuit that includes biased varacter diodes, an analog phase shifter, etc. To illustrate, the phase adjuster includes a first resistor coupled to an input node at one end. Another end of the first resistor is coupled via a first node to a first variable capacitor, which is coupled via a second node to a second resistor. The second resistor is coupled via a third node to a second variable capacitor. The second variable capacitor is coupled via the input node to the first resistor so that a loop having the first resistor, the first capacitor, the second resistor, and the second capacitor is formed. The input node receives an RF signal. The second node is connected to ground. A phase difference is achieved between the first and third nodes by controlling capacitances of the first and second capacitors.

An example of a frequency multiplier includes a circuit that includes one or more inductors, one or more capacitors, and one or more diodes. To illustrate, the frequency multiplier includes a first inductor coupled at one end to an input node and coupled at another end via a first node to a first capacitor, which is coupled to ground. The first node is coupled to a p junction of a first diode, which has an n junction that is coupled at a second node to a second inductor. The second inductor is coupled to ground. The second node is coupled to an n junction of a second diode. A p junction of the second diode is coupled at a third node to a third inductor connected in parallel to a second capacitor, and the parallel circuit is coupled to ground. The third node is coupled to a fourth inductor, which is further coupled in series to a third capacitor, which is variable, and the third capacitor is coupled to an output node of the frequency multiplier.

As an example, the adder 114 is an amplifier with its negative input node coupled to multiple RF cables, e.g., an RF cable 134, an RF cable 138, and an RF cable 146, etc., for receiving RF signals via the RF cables, and a positive input node coupled to a ground voltage. An output node of the amplifier is coupled to the RF transmission line 118. The negative input node is coupled to one end of a resistor and the output node of the amplifier is coupled to another end of the resistor. The amplifier of the adder 114 has a gain of 1:1. As another example, the adder 114 is a connection point, e.g., a connection point of an RF cable, etc., that connects the multiple RF cables, e.g., the RF cable 134, the RF cable 138, and the RF cable 146, etc., used as transfer mediums for reception of RF signals by the adder 114.

An input node of the IMC 106 is coupled to an output node of the RF power supply 104 via the RF cable 105. Moreover, an output node of the IMC 106 is coupled to an input node of the frequency multiplier 108 via an RF cable 128. An output node of the frequency multiplier 108 is coupled to an input node of the amplitude adjuster 110 via an RF cable 130. An output node of the amplitude adjuster 110 is coupled to an input node of the phase adjuster 112 via an RF cable 132. An output node of the phase adjuster 112 is coupled to an input node of the adder 114 via the RF cable 134. Moreover, another output node of the IMC 106 is coupled to an input node of the amplitude adjuster 120 via an RF cable 136. An output node of the amplitude adjuster 120 is coupled to another input node of the adder 114 via the RF cable 138. Yet another output node of the IMC 106 is coupled to an input node of the frequency multiplier 122 via an RF cable 140. An output node of the frequency multiplier 122 is coupled to an input node of the amplitude adjuster 124 via an RF cable 142. An output node of the amplitude adjuster 124 is coupled to an input node of the phase adjuster 126 via an RF cable 144. An output node of the phase adjuster 126 is coupled to yet another input node of the adder 114 via the RF cable 146. An output node of the adder 114 is coupled to the plasma chamber 116 via an RF transmission line 118.

The RF power supply 104 generates an RF signal of an $n^{th}$ harmonic and sends the RF signal via the RF cable 105 to the IMC 106, where n is an odd number. For example, n is equal to one. As an example, the RF power supply 104 generates the RF signal that has a frequency that is an odd multiple of a fundamental frequency of an RF signal. To illustrate, the RF power supply 104 generates the RF signal that is a $1^{st}$ harmonic waveform. The RF signal generated by the RF power supply 104 has a phase Pn. The IMC 106 receives the RF signal from the RF power supply 104 and matches an impedance of a load coupled to the IMC 106 with impedance of a source coupled to the IMC 106 to generate a modified RF signal of the $n^{th}$ harmonic based on the received RF signal. The modified RF signal has the phase Pn. Examples of the load coupled to the IMC 106 include the frequency multiplier 108, the amplitude adjuster 110, the phase adjuster 112, the adder 114, the amplitude adjuster 120, the frequency multiplier 122, the amplitude adjuster 124, the phase adjuster 126, the plasma chamber 116, and the RF cables 128, 130, 132, 134, 136, 138, 140, 142, 144, and 146. Examples of the source coupled to the IMC 106 include the RF cable 105 and the RF power supply 104.

The modified RF signal of the $n^{th}$ harmonic is provided from the IMC 106 via the RF cable 136 to the amplitude adjuster 120. The amplitude adjuster 120 changes, e.g., increases by a pre-determined amount, decreases by a pre-determined amount, etc., an amplitude, e.g., a magnitude, an envelope, a peak-to-peak amplitude, a root mean square (RMS) value etc., of the modified RF signal to generate an amplified signal having an amplitude An, and sends the amplified signal having the phase Pn and the amplitude An via the RF cable 138 to the adder 114.

Moreover, the modified RF signal of the $n^{th}$ harmonic is provided from the IMC 106 via the RF cable 128 to the frequency multiplier 108. The frequency multiplier 108 multiplies a frequency of the modified RF signal of the $n^{th}$ harmonic by two to generate an $(n+2)^{th}$ harmonic signal, e.g., a modified RF signal of the third harmonic, etc. The $(n+2)^{th}$ harmonic signal is sent from the frequency multiplier 108 via the RF cable 130 to the amplitude adjuster 110. The amplitude adjuster 110 modifies, e.g., increases by a pre-determined amount, decreases by a pre-determined amount, etc., the amplitude A(n) of the $(n+2)^{th}$ harmonic signal to an amplitude A(n+2) to generate an amplified signal, and sends the amplified signal via the RF cable 132 to the phase adjuster 112. As an example, the amplitude A(n+2) is different from, e.g., less than, etc., the amplitude A(n). The phase adjuster 112 adjusts, e.g., shifts forward by a pre-determined amount, shifts backward by a pre-determined amount, creates a pre-determined amount of lag, creates a pre-determined amount of lead, etc., the phase P(n) of the amplified signal to P(n+2) to output an RF signal having the phase P(n+2) and the amplitude A(n+2) and sends the RF signal via the RF cable 134 to the adder 114.

Further, the modified RF signal of the $n^{th}$ harmonic is provided from the IMC 106 via the RF cable 140 to the frequency multiplier 122. The frequency multiplier 122 multiplies a frequency of the modified RF signal of the $n^{th}$ harmonic by four to generate an $(n+4)^{th}$ harmonic signal, e.g., a modified RF signal of the fifth harmonic, etc. The $(n+4)^{th}$ harmonic signal is sent from the frequency multiplier 122 via the RF cable 142 to the amplitude adjuster 124. The amplitude adjuster 124 modifies, e.g., increases by a pre-determined amount, decreases by a pre-determined amount, etc., the amplitude A(n) of the $(n+4)^{th}$ harmonic signal to an amplitude A(n+4) to generate an amplified signal, and sends the amplified signal via the RF cable 144 to the phase adjuster 126. As an example, the amplitude A(n+4) is different from, e.g., less than, etc., the amplitude A(n+2). The phase adjuster 126 adjusts, e.g., shifts forward by a pre-determined amount, shifts backward by a pre-determined amount, creates a pre-determined amount of lag, creates a pre-determined amount of lead, etc., the phase P(n) of the amplified signal to P(n+4) to output an RF signal having the phase P(n+4) and the amplitude A(n+4) and sends the RF signal via the RF cable 146 to the adder 114.

The adder 114 sums the RF signals received via the RF cables 134, 138, and 146 to output an added RF signal, and sends the added RF signal via the RF transmission line 118 to an electrode of the plasma chamber 116 for processing, e.g., cleaning, etching, depositing materials on, sputtering, etc., a substrate, e.g., a wafer, etc., within the plasma chamber 116. For example, the adder 114 adds amplitudes, e.g., peak-to-peak amplitudes, magnitudes, RMS values, etc., of the RF signals received via the RF cables 134, 138, and 146 to generate the added RF signal.

In some embodiments, the system 100 excludes the frequency multiplier 122, the amplitude adjuster 124, and the phase adjuster 126. In various embodiments, the system 100 excludes the frequency multiplier 108, the amplitude adjuster 110, and the phase adjuster 112. In several embodiments, the system 100 excludes the amplitude adjuster 110 or the phase adjuster 112. For example, the frequency multiplier 108 is coupled to the phase adjuster 112 via the RF cable 130 without being coupled to the amplitude adjuster 110. As another example, the amplitude adjuster 110 is coupled to the adder 114 via the RF cable 134 without being coupled to the phase adjuster 112. In some embodiments, the system 100 excludes the amplitude adjuster 124 or the phase adjuster 126.

In various embodiments, positions of a phase adjuster and an amplitude adjuster are switched compared to that illustrated in FIG. 1. For example, the input node of the phase adjuster 112 is coupled to the output node of the frequency multiplier 108 and the input node of the amplitude adjuster 110 is coupled to the output node of the phase adjuster 112. The output node of the amplitude adjuster 112 is coupled to the adder 114. Similarly, in some embodiments, the input node of the phase adjuster 126 is coupled to the output node of the frequency multiplier 122 and the input node of the amplitude adjuster 124 is coupled to the output node of the phase adjuster 126. The output node of the amplitude adjuster 124 is coupled to the adder 114.

In some embodiments, a phase or an amplitude is sometimes referred to herein as a variable.

In various embodiments, the RF generator 102 excludes the amplitude adjuster 120 and the IMC 106 is coupled to the adder 114 via the RF cable 136 without the amplitude adjuster 120 and the RF cable 138 coupled between the IMC 106 and the adder 114. In these embodiments, the amplitude of the modified RF signal output from the IMC 106 via the RF cable 136 to the adder 114 is An, which is the same as an amplitude of the RF signal generated by the RF power supply 104. Moreover, in these embodiments, the adder 114 adds the modified RF signal received from the IMC 106 via the RF cable 136 with the RF signals received via the RF cables 134 and 146 to generate an added signal, which is provided via the RF transmission line 118 to the electrode of the plasma chamber 116 for processing the substrate.

Figure 2:
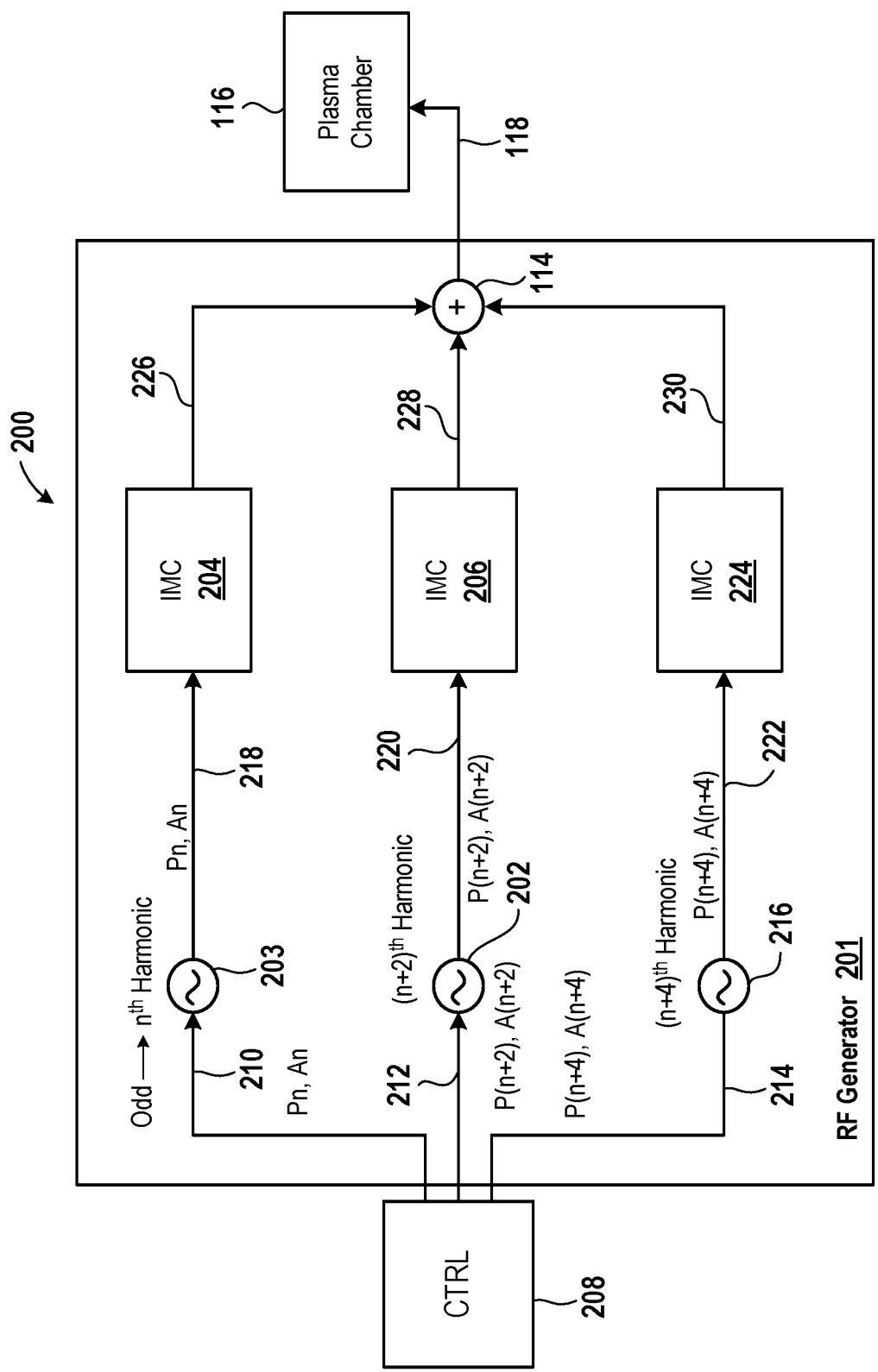
FIG. 2 is a diagram of another embodiment of a plasma system for illustrating a combination of multiple radio frequency (RF) signals of odd harmonics for processing a substrate.

FIG. 2 is a diagram of an embodiment of a system 200 for illustrating a combination of multiple RF signals of odd harmonics for processing the substrate. The system 200 includes an RF generator 201, a controller 208, and the plasma chamber 116. As used herein a controller includes a processor and a memory device coupled to the processor. Examples of the processor includes a central processing unit (CPU), an application specific integrated circuit (ASIC), and a programmable logic device (PLD). Examples of the memory device include a read-only memory (ROM), a random access memory (RAM), a hard disk, a volatile memory, a non-volatile memory, a redundant array of storage disks, a Flash memory, etc.

The RF generator 201 includes an RF power supply 203, an RF power supply 202, an RF power supply 216, an IMC 204, an IMC 206, an IMC 224, and the adder 114. In various embodiments, each of the RF power supplies 203, 202, and 216 has a fundamental frequency of 400 kHz or 2 MHz. In some embodiments, each of the RF power supplies 203, 202, and 216 has a fundamental frequency of 27 MHz or 60 MHz. An output port of the controller 208 is coupled to an input node of the RF power supply 203 via a transfer cable 210. Examples of a transfer cable include a serial transfer cable used to transfer data serially, e.g., one bit at a time, etc., a parallel transfer cable to transfer data in a parallel manner, e.g., multiple bits at a time, etc., and a Universal Serial Bus (USB) cable, etc. An output node of the RF power supply 203 is coupled to an input node of the IMC 204 via an RF cable 218. An output node of the IMC 204 is coupled to an input node of the adder 114 via an RF cable 226.

Similarly, another output port of the controller 208 is coupled to an input node of the RF power supply 202 via a transfer cable 212. An output node of the RF power supply 202 is coupled to an input node of the IMC 206 via an RF cable 220. An output node of the IMC 206 is coupled to an input node of the adder 114 via an RF cable 228.

Moreover, similarly, yet another output port of the controller 208 is coupled to an input node of the RF power supply 216 via a transfer cable 214. An output node of the RF power supply 216 is coupled to an input node of the IMC 224 via an RF cable 222. An output node of the IMC 224 is coupled to an input node of the adder 114 via an RF cable 230.

Each of the RF power supplies 203, 202, and 216 includes a driver, e.g., one or more transistors, etc. Moreover, each of the RF power supplies 203, 202, and 216 includes an amplifier and an RF oscillator. The driver is coupled to a corresponding one of the transfer cables 210, 212, and 214. For example, the driver of the RF power supply 203 is coupled to the transfer cable 210, the driver of the RF power supply 202 is coupled to the transfer cable 212, and the driver of the RF power supply 216 is coupled to the transfer cable 214. An input node of the amplifier of the RF power supply, e.g., the RF power supply 203, the RF power supply 202, or the RF power supply 216, etc., is coupled to the driver of the RF power supply. An output node of the amplifier of the RF power supply, e.g., the RF power supply 203, the RF power supply 202, or the RF power supply 216, etc., is coupled to an input node of an RF oscillator of the RF power supply. An output node of the RF oscillator of the RF power supply, e.g., the RF power supply 203, the RF power supply 202, or the RF power supply 216, etc., is coupled to a corresponding RF cable. For example, the output node of the RF oscillator of the RF power supply 203 is coupled to the RF cable 218, the output node of the RF oscillator of the RF power supply 202 is coupled to the RF cable 220, and the output node of the RF oscillator of the RF power supply 216 is coupled to the RF cable 222.

The processor of the controller 208 sends a control signal to the driver of the RF power supply 203 via the transfer cable 210 to generate a current signal. The control signal is sent at a time to the driver of the RF power supply 203 to achieve the phase Pn of an RF signal generated by the RF oscillator of the RF power supply 203. The driver of the RF power supply 203 sends the current signal to the amplifier of the RF power supply 203 to amplify the current signal to further achieve the amplitude An of the RF signal that is output from the RF oscillator of the RF power supply 203. For example, the processor of the controller 208 is coupled to a gain control node of the amplifier of the RF power supply 203 via a cable and controls a gain of the amplifier to achieve the amplitude An. To illustrate, the processor changes a voltage of a control signal applied to the gain control node of the amplifier of the RF power supply 203 to change a gain of the amplifier. The RF oscillator of the RF power supply 203 upon receiving the amplified current signal from the amplifier of the RF power supply 203 generates the RF signal having the amplitude An, the phase Pn, and a frequency fn, where fn is an $n^{th}$ odd harmonic frequency, e.g., first odd harmonic frequency, etc. To illustrate, the RF oscillator of the RF power supply 203 oscillates with the $n^{th}$ odd harmonic frequency. The RF signal is provided from the RF oscillator of the RF power supply 203 via the RF cable 218 to the IMC 204. An example of the RF signal generated by the RF power supply 203 is an odd harmonic waveform, e.g., a $1^{st}$ harmonic waveform, etc. The IMC 204 receives the RF signal from the RF power supply 203 and matches an impedance of a load, e.g., the RF cable 226, the adder 114, the RF transmission line 118, and the plasma chamber 116, etc., that is coupled to the output node of the IMC 204 with an impedance of a source, e.g., RF power supply 203 and the RF cable 218, etc., that is coupled to the input node of the IMC 204 to generate a modified RF signal. The modified RF signal is sent from the IMC 204 via the RF cable 226 to the adder 114.

Similarly, the processor of the controller 208 sends another control signal to the driver of the RF power supply 202 via the transfer cable 212 to generate a current signal. The control signal is sent at a time to the driver of the RF power supply 202 to achieve the phase P(n+2) of an RF signal generated by the RF oscillator of the RF power supply 202. For example, to achieve the phase P(n+2), the control signal is sent from the processor at a time after a predetermined period of time from a time at which the control signal is sent from the processor to the RF power supply 203. The driver of the RF power supply 202 sends the current signal to the amplifier of the RF power supply 202 to amplify the current signal to further achieve the amplitude A(n+2) of the RF signal that is output from the RF oscillator of the RF power supply 202. For example, the processor of the controller 208 is coupled to a gain control node of the amplifier of the RF power supply 202 via a cable and controls a gain of the amplifier to achieve the amplitude A(n+2). To illustrate, the processor changes a voltage of a control signal applied to the gain control node of the amplifier of the RF power supply 202 to change a gain of the amplifier. The RF oscillator of the RF power supply 202 upon receiving the amplified current signal from the amplifier of the RF power supply 202 generates the RF signal having the amplitude A(n+2), the phase P(n+2), and a frequency f(n+2), where f(n+2) is an $(n+2)^{th}$ odd harmonic frequency, e.g., third odd harmonic frequency, etc. To illustrate, the RF oscillator of the RF power supply 202 oscillates with the $(n+2)^{th}$ odd harmonic frequency. An example of the RF signal generated by the RF power supply 202 is an odd harmonic waveform, e.g., a $3^{rd}$ harmonic waveform, etc. The RF signal is provided from the RF oscillator of the RF power supply 202 via the RF cable 220 to the IMC 206. The IMC 206 receives the RF signal from the RF power supply 202 and matches an impedance of a load, e.g., the RF cable 228, the adder 114, the RF transmission line 118, and the plasma chamber 116, etc., that is coupled to the output node of the IMC 206 with an impedance of a source, e.g., the RF power supply 202 and the RF cable 220, etc., that is coupled to the input node of the IMC 206 to generate a modified RF signal. The modified RF signal is sent from the IMC 206 via the RF cable 228 to the adder 114.

Furthermore, similarly, the processor of the controller 208 sends yet another control signal to the driver of the RF power supply 216 via the transfer cable 214 to generate a current signal. The control signal is sent at a time to the driver of the RF power supply 216 to achieve the phase P(n+4) of an RF signal generated by the RF oscillator of the RF power supply 216. For example, to achieve the phase P(n+4), the control signal is sent from the processor at a time after a pre-determined period of time from a time at which the control signal is sent from the processor to the RF power supply 202. The driver of the RF power supply 216 sends the current signal to the amplifier of the RF power supply 216 to amplify the current signal to further achieve the amplitude A(n+4) of the RF signal that is output from the RF oscillator of the RF power supply 216. For example, the processor of the controller 208 is coupled to a gain control node of the amplifier of the RF power supply 216 via a cable and controls a gain of the amplifier to achieve the amplitude A(n+4). To illustrate, the processor changes a voltage of a control signal applied to the gain control node of the amplifier of the RF power supply 216 to change a gain of the amplifier. The RF oscillator upon receiving the amplified current signal generates the RF signal having the amplitude A(n+4), the phase P(n+4), and a frequency f(n+4), where f(n+4) is an $(n+4)^{th}$ odd harmonic frequency, e.g., fifth odd harmonic frequency, etc. To illustrate, the RF oscillator of the RF power supply 216 oscillates with the $(n+4)^{th}$ odd harmonic frequency. The RF signal is provided from the RF oscillator of the RF power supply 216 via the RF cable 222 to the IMC 224. An example of the RF signal generated by the RF power supply 216 is an odd harmonic waveform, e.g., a $5^{th}$ harmonic waveform, etc. The IMC 224 receives the RF signal from the RF power supply 216 and matches an impedance of a load, e.g., the RF cable 230, the adder 114, the RF transmission line 118, and the plasma chamber 116, etc., that is coupled to the output node of the IMC 224 with an impedance of a source, e.g., the RF power supply 216 and the RF cable 222, etc., that is coupled to the input node of the IMC 224 to generate a modified RF signal. The modified RF signal is sent from the IMC 224 via the RF cable 230 to the adder 114.

The adder 114 adds the modified RF signals, e.g., amplitudes of the modified RF signals, RMS values of the modified RF signals, peak-to-peak amplitudes of the modified RF signals, envelopes of the modified RF signals, etc., received from the IMCs 204, 206, and 224 to generate an added signal. The added signal is sent from the adder 114 via the RF transmission line 118 to the electrode of the plasma chamber 116 for processing the substrate in the plasma chamber 116. For example, an impedance of plasma within the plasma chamber 116 is modified by the added signal received from the adder 114 by the electrode of the plasma chamber 116.

In some embodiments, instead of the IMC 204 coupled between the RF power supply 203 and the adder 114, instead of the IMC 206 coupled between the RF power supply 202 and the adder 114, and instead of the IMC 224 coupled between the RF power supply 216 and the adder 114, an IMC (not shown) is coupled between the adder 114 and the plasma chamber 116. For example, an input node of the IMC (not shown) is coupled to the adder 114 via an RF cable (not shown) and an output node of the IMC is coupled to the plasma chamber 116 via the RF transmission line 118. Moreover, the adder 114 is coupled via the RF cable 218 to the RF power supply 203 without being coupled to the IMC 204. The adder 114 is coupled via the RF cable 220 to the RF power supply 202 without being coupled to the IMC 206. The adder 114 is coupled via the RF cable 222 to the RF power supply 216 without being coupled to the IMC 224. The RF signals output from the RF power supplies 203, 202, and 216 are received by the adder 114 and summed by the adder 114 to generate an added signal, which is sent from the adder 114 to the IMC (not shown) via the RF cable (not shown). The IMC (not shown) matches an impedance of a load, e.g., the RF transmission line 118 and the plasma chamber 116, etc., coupled to the output node of the IMC (not shown) with an impedance of a source, e.g., the RF cable (not shown), the adder 114, the RF cables 218, 220, and 222, and the RF power supplies 203, 202, and 216, etc., to output a modified RF signal. The modified RF signal is sent from the IMC (not shown) via the RF transmission line 118 to the plasma chamber 116 for processing the substrate.

In some embodiments, the controller 208 includes multiple processors instead of the processor and the multiple processors are coupled to the memory device. For example, operations described herein as being performed by the processor of the controller 208 are distributed among the multiple processors. In various embodiments, the controller 108 includes multiple processors instead of the processor and includes multiple memory devices instead of the memory device, and the multiple processors are coupled to the memory devices. For example, operations described herein as being performed by the processor of the controller 208 are distributed among the multiple processors, and data described herein as being stored in the memory device is distributed among the memory devices.

Figure 3:
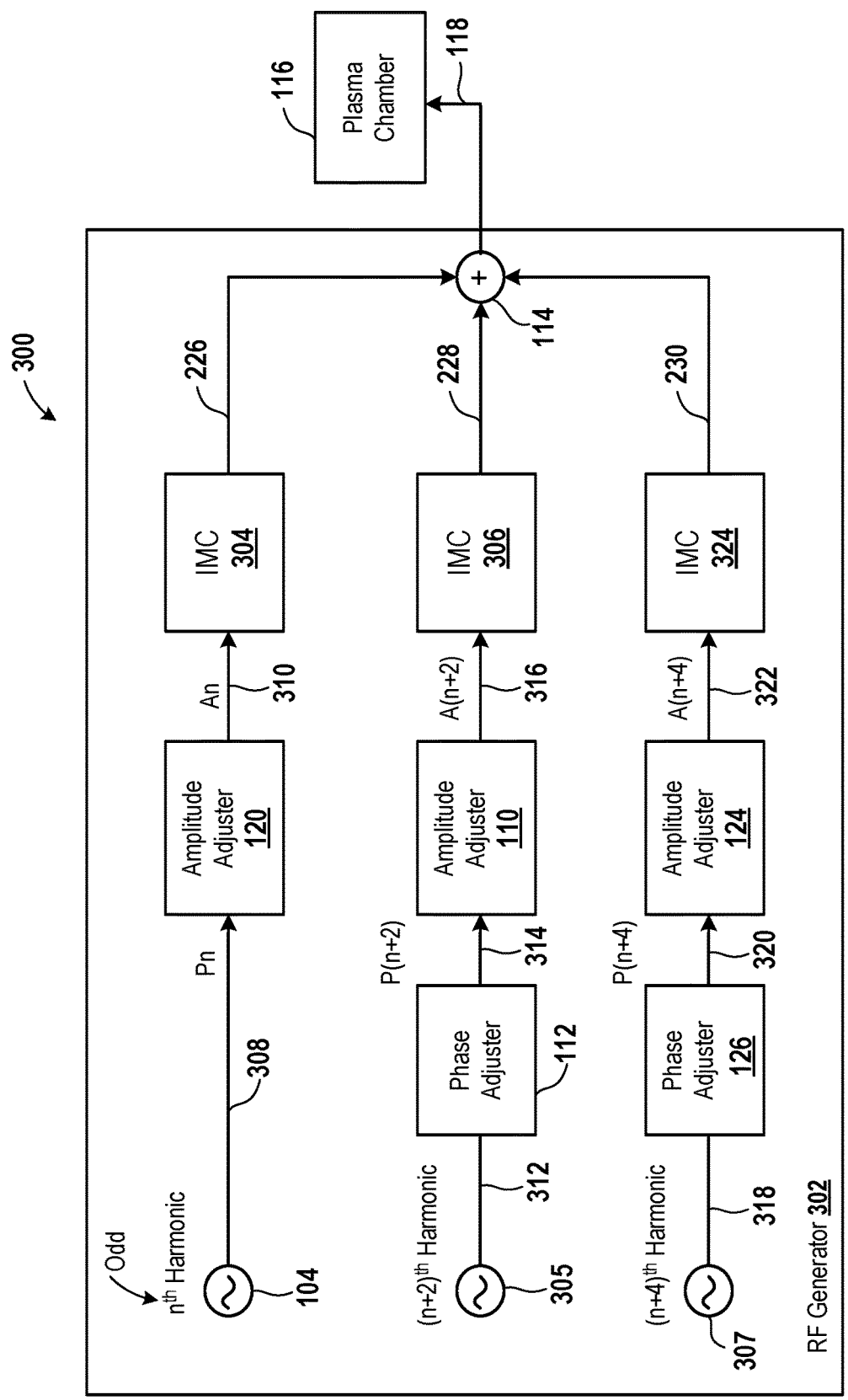
FIG. 3 is a diagram of yet another embodiment of a plasma system to illustrate combination of RF signals of odd harmonics to provide to the substrate for processing.

FIG. 3 is a diagram of an embodiment of a system 300 to illustrate combination of RF signals of odd harmonics to provide to the substrate for processing. The system 300 includes an RF generator 302 and the plasma chamber 116. The RF generator 302 includes the RF power supply 104, e.g., an RF oscillator, etc. The RF generator 302 further includes the amplitude adjuster 120, an IMC 304, the adder 114, and an RF power supply 305, e.g., an RF oscillator, etc. The RF generator also includes the phase adjuster 112, the amplitude adjuster 110, an IMC 306, an RF power supply 307, the phase adjuster 126, the amplitude adjuster 124, and an IMC 324. In various embodiments, each of the RF power supplies 305 and 307 has a fundamental frequency of 400 kHz or 2 MHz. In some embodiments, each of the RF power supplies 305 and 307 has a fundamental frequency of 27 MHz or 60 MHz.

The output node of the RF power supply 104 is coupled via an RF cable 308 to the input node of the amplitude adjuster 120. The output node of the amplitude adjuster 120 is coupled via an RF cable 310 to an input node of an IMC 304. An output node of the IMC 304 is coupled via the RF cable 226 to an input node of the adder 114.

Moreover, the output node of the RF power supply 305 is coupled via an RF cable 312 to the input node of the phase adjuster 112. The output node of the phase adjuster 112 is coupled via an RF cable 314 to the input node of the amplitude adjuster 110. The output node of the amplitude adjuster 110 is coupled via an RF cable 316 to an input node of an IMC 306. An output node of the IMC 306 is coupled via the RF cable 228 to an input node of the adder 114.

Furthermore, the output node of the RF power supply 307 is coupled via an RF cable 318 to the input node of the phase adjuster 126. The output node of the phase adjuster 126 is coupled via an RF cable 320 to the input node of the amplitude adjuster 124. The output node of the amplitude adjuster 124 is coupled via an RF cable 322 to an input node of an IMC 324. An output node of the IMC 324 is coupled via the RF cable 230 to an input node of the adder 114.

The RF power supply 104 generates an RF signal having the phase Pn, and supplies the RF signal via the RF cable 308 to the amplitude adjuster 120. For example, the RF power supply 104 generates an odd harmonic waveform, e.g., an $n^{th}$ harmonic waveform, a first harmonic waveform, etc. The amplitude adjuster 120 changes, e.g., increases by a pre-determined amount, decreases by a pre-determined amount, etc., an amplitude, e.g., a magnitude, a peak-to-peak amplitude, a root mean square (RMS) value etc., of the RF signal to generate an amplified signal having the amplitude An and the phase Pn, and sends the amplified signal having the phase Pn and the amplitude An via the RF cable 310 to the IMC 304.

The IMC 304 receives the amplified signal from the amplitude adjuster 120 and matches an impedance of a load, e.g., the RF cable 226, the adder 114, the RF transmission line 118, and the plasma chamber 116, etc., that is coupled to the output node of the IMC 304 with an impedance of a source, e.g., RF power 104, the RF cable 308, the amplitude adjuster 120, and the RF cable 310, etc., that is coupled to the input node of the IMC 304 to generate a modified RF signal. The modified RF signal is sent from the IMC 304 via the RF cable 226 to the adder 114.

Similarly, the RF power supply 305 generates an RF signal, and supplies the RF signal via the RF cable 312 to the phase adjuster 112. For example, the RF power supply 305 generates an $(n+2)^{th}$ harmonic waveform, e.g., an odd harmonic waveform, a third harmonic waveform, etc. The phase adjuster 112 adjusts, e.g., shifts forward by a pre-determined amount, shifts backward by a pre-determined amount, creates a pre-determined amount of lag, creates a pre-determined amount of lead, etc., a phase of the RF signal received from the RF power supply 305 to P(n+2) to output an RF signal having the phase P(n+2) and sends the RF signal via the RF cable 314 to the amplitude adjuster 110. The amplitude adjuster 110 changes, e.g., increases by a pre-determined amount, decreases by a pre-determined amount, etc., an amplitude, e.g., a magnitude, a peak-to-peak amplitude, a root mean square (RMS) value etc., of the RF signal received from the phase adjuster 112 to generate an amplified signal having the amplitude A(n+2) and the phase P(n+2), and sends the amplified signal via the RF cable 316 to the IMC 306.

The IMC 306 receives the amplified signal from the amplitude adjuster 110 and matches an impedance of a load, e.g., the RF cable 228, the adder 114, the RF transmission line 118, and the plasma chamber 116, etc., that is coupled to the output node of the IMC 306 with an impedance of a source, e.g., the RF power supply 305, the RF cable 312, the phase adjuster 112, the RF cable 314, the amplitude adjuster 110, and the RF cable 316, etc., that is coupled to the input node of the IMC 306 to generate a modified RF signal. The modified RF signal is sent from the IMC 306 via the RF cable 228 to the adder 114.

Moreover, similarly, the RF power supply 307 generates an RF signal, and supplies the RF signal via the RF cable 318 to the phase adjuster 126. For example, the RF power supply 307 generates an $(n+4)^{th}$ harmonic waveform, e.g., an odd harmonic waveform, a fifth harmonic waveform, etc. The phase adjuster 126 adjusts, e.g., shifts forward by a pre-determined amount, shifts backward by a pre-determined amount, creates a pre-determined amount of lag, creates a pre-determined amount of lead, etc., a phase of the RF signal received from the RF power supply 307 to P(n+4) to output an RF signal having the phase P(n+4) and sends the RF signal via the RF cable 320 to the amplitude adjuster 124. The amplitude adjuster 124 changes, e.g., increases by a pre-determined amount, decreases by a pre-determined amount, etc., an amplitude, e.g., a magnitude, a peak-to-peak amplitude, a root mean square (RMS) value etc., of the RF signal received from the phase adjuster 126 to generate an amplified signal having the amplitude A(n+4) and the phase P(n+4), and sends the amplified signal via the RF cable 230 to the IMC 114.

The IMC 324 receives the amplified signal from the amplitude adjuster 124 and matches an impedance of a load, e.g., the RF cable 228, the adder 114, the RF transmission line 118, and the plasma chamber 116, etc., that is coupled to the output node of the IMC 324 with an impedance of a source, e.g., the RF power supply 307, the RF cable 318, the phase adjuster 126, the RF cable 320, the amplitude adjuster 124, and the RF cable 322, etc., that is coupled to the input node of the IMC 324 to generate a modified RF signal. The modified RF signal is sent from the IMC 324 via the RF cable 230 to the adder 114.

The adder 114 adds the modified RF signals, e.g., amplitudes of the modified RF signals, RMS values of the modified RF signals, peak-to-peak amplitudes of the modified RF signals, envelopes of the modified RF signals, etc., received from the IMCs 304, 306, and 324 to generate an added signal. The added signal is sent from the adder 114 via the RF transmission line 118 to the electrode of the plasma chamber 116 for processing the substrate in the plasma chamber 116.

In various embodiments, positions of a phase adjuster and an amplitude adjuster that are coupled in series within the RF generator 302 are switched compared to that illustrated in FIG. 3. For example, the input node of the amplitude adjuster 110 is coupled to the output node of the RF power supply 305 and the output node of the amplitude adjuster 110 is coupled to the input node of the phase adjuster 112. The output node of the phase adjuster 112 is coupled to the input node of the IMC 306. Similarly, in some embodiments, the input node of the amplitude adjuster 124 is coupled to the output node of the RF power supply 307 and the output node of the amplitude adjuster 124 is coupled to the input node of the phase adjuster 126. The output node of the phase adjuster 126 is coupled to the input node of the IMC 324.

In several embodiments, the RF generator 302 excludes the amplitude adjuster 120, and in these embodiments, the IMC 304 is coupled to the adder RF power supply 104 via the RF cable 308 without the amplitude adjuster 120 and the RF cable 310 being coupled between the RF power supply 104 and the IMC 304. In these embodiments, the amplitude of the RF signal generated by the RF power supply 104 is An. The RF power supply 104 provides an RF signal of the $n^{th}$ odd harmonic having the phase Pn and the amplitude An to the IMC 304 via the RF cable 308. The IMC 304 matches an impedance of the load coupled to the IMC 304 with that of a source, e.g., the RF power supply 104 and the RF cable 308, etc., to generate a modified RF signal. The modified RF signal is provided via the RF cable 226 to the adder 114 for summation with the RF signals received via the RF cables 228 and 230 to generate an added signal, which is provided via the RF transmission line 118 to the electrode of the plasma chamber 116 for processing the substrate.

In some embodiments, the system 300 excludes the phase adjuster 112 or the amplitude adjuster 110. For example, the phase adjuster 112 is coupled via the RF cable 314 to the IMC 306 without being coupled to the amplitude adjuster 110. As another example, the RF power supply 305 is coupled to the amplitude adjuster 110 via the RF cable 312 without being coupled to the phase adjuster 112. In various embodiments, the system 300 excludes the phase adjuster 126 or the amplitude adjuster 124.

In several embodiments, the system 300 excludes the RF power supply 307, the phase adjuster 126, the amplitude adjuster 124, and the IMC 324. In some embodiments, the system 300 excludes the RF power supply 305, the phase adjuster 112, the amplitude adjuster 110, and the IMC 306.

In some embodiments, instead of the IMC 304 coupled between the amplitude adjuster 120 and the adder 114, instead of the IMC 306 is coupled between the amplitude adjuster 110 and the adder 114, and instead of the IMC 324 coupled between the amplitude adjuster 124 and the adder 114, an IMC (not shown) is coupled between the adder 114 and the plasma chamber 116. For example, an input node of the IMC (not shown) is coupled to the adder 114 via an RF cable (not shown) and an output node of the IMC is coupled to the plasma chamber 116 via the RF transmission line 118. Moreover, the adder 114 is coupled via the RF cable 226 to the amplitude adjuster 120 without being coupled to the IMC 304. The adder 114 is coupled via the RF cable 228 to the amplitude adjuster 110 without being coupled to the IMC 306. The adder 114 is coupled via the RF cable 230 to the amplitude adjuster 124 without being coupled to the IMC 324. The amplified signals output from the amplitude adjusters 120, 110, and 124 are received by the adder 114 and summed by the adder 114 to generate an added signal, which is sent from the adder 114 to the IMC (not shown) via the RF cable (not shown). The IMC (not shown) matches an impedance of a load, e.g., the RF transmission line 118 and the plasma chamber 116, etc., coupled to the output node of the IMC (not shown) with an impedance of a source, e.g., the RF cable (not shown), the adder 114, the RF cables 226, 228, and 230, the amplitude adjusters 120, 110, and 124, the RF cables 308, 314, 320, 312, and 318, the phase adjusters 112 and 126, and the RF power supplies 104, 305, and 307, etc., to output a modified RF signal. The modified RF signal is sent from the IMC (not shown) via the RF transmission line 118 to the plasma chamber 116 for processing the substrate.

In various embodiments, the added signal that is supplied via the RF transmission line 118 of any of FIGS. 1-3 does not have a combination of even harmonic RF signals.

Figure 4:
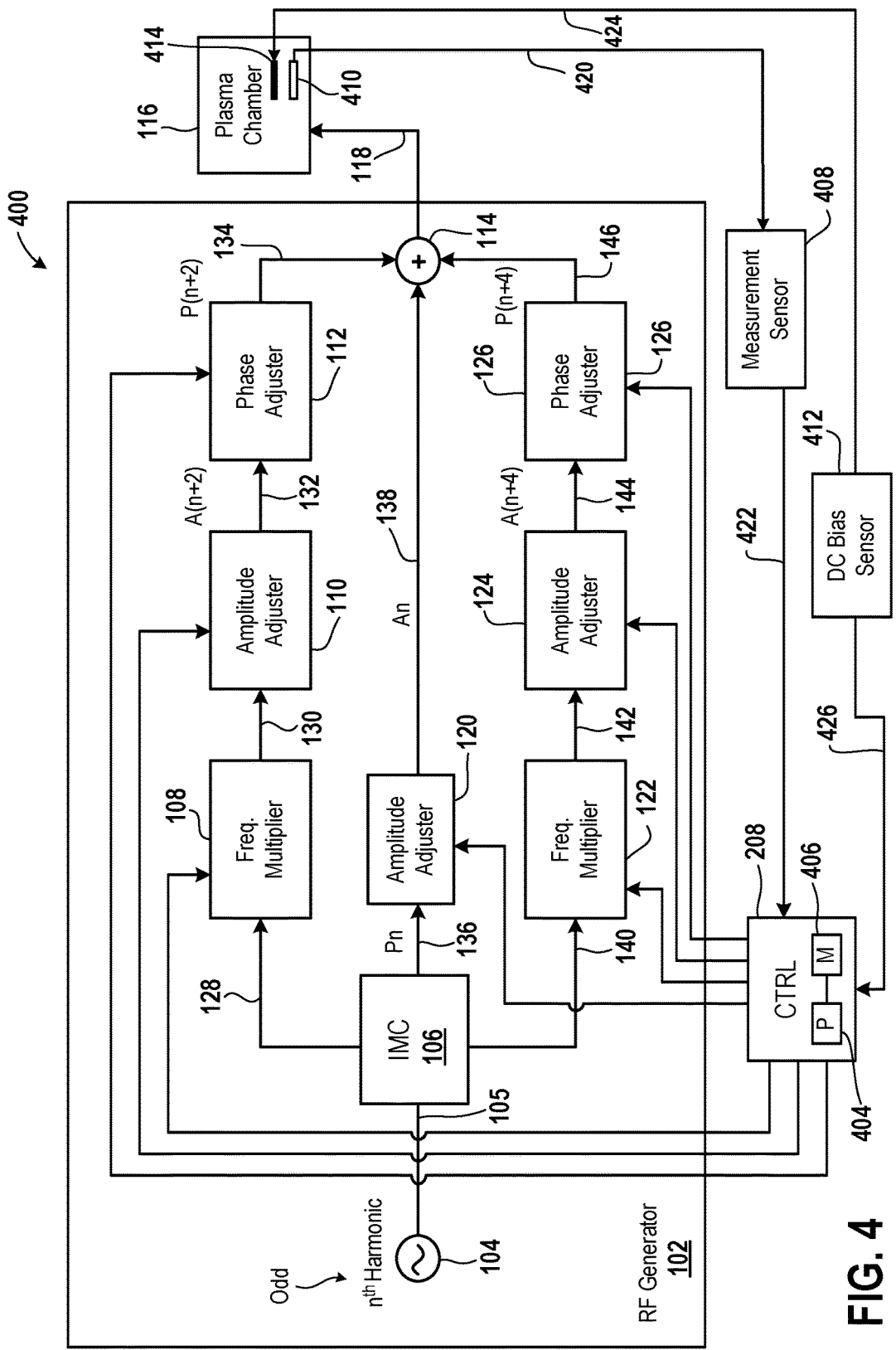
FIG. 4 is a diagram of an embodiment of a plasma system to illustrate use of one or more parameters to change a phase and/or an amplitude of an RF signal for controlling a process applied to the substrate.

FIG. 4 is a diagram of an embodiment of a system 400 to illustrate use of one or more parameters, e.g., ion flux, complex current, complex voltage, complex voltage and current, complex impedance, etc., to change a phase and/or an amplitude of an RF signal for controlling a process applied to the substrate. The system 400 includes the system 100 (FIG. 1) and further includes a measurement sensor 408, a planar ion flux probe 410, a direct current (DC) bias probe 414, a DC bias sensor 412, and the controller 208. In some embodiments, the ion flux probe 410 has a unit surface area. The host computer 306 includes a processor 404 and a memory device 406 that is coupled to the processor 404. The planar ion flux probe 410 is coupled to the measurement sensor 408 via a cable 420 and the measurement sensor 408 is coupled to the processor 404 of the controller 208 via a transfer cable 422. Similarly, the DC bias probe 414 is coupled to the DC bias sensor 412 via a cable 424 and the DC bias sensor 412 is coupled to the processor 404 via a transfer cable 426. An example of the planar ion flux probe 410 is a Langmuir probe. Other examples of the ion flux probe 310 include a capacitor and an ion collector. Examples of the measurement sensor 408 include a complex voltage sensor or a complex current sensor.

In some embodiments, the planar ion flux probe 410 is embedded within a component, e.g., an upper electrode, etc., of the plasma chamber 116 and the DC bias probe 414 is embedded within a component, e.g., an edge ring, etc., of the plasma chamber 116. The edge ring surrounds a chuck of the plasma chamber 116.

When the substrate is being processed within the plasma chamber 116, the planar ion flux probe 410 measures ion flux, e.g., an amount of ion flow per unit surface area and per unit time of the ion flux probe 410, an amount of current per unit surface area of the ion flux probe 410, etc., of plasma within the plasma chamber 116 to generate an electrical signal. The electrical signal passes via the cable 420 to the measurement sensor 408, which measures a complex voltage or a complex current of the electrical signal. The measurement sensor 408 outputs the measured complex voltage or the measured complex current as data via the transfer cable 422 to the processor 404. In some embodiments, the processor 404 receives the measured complex current and divides the measured complex current by a surface area of the planar ion flux probe 410 to determine ion flux of plasma within the plasma chamber 116.

The processor 404 determines that the measured parameter is not within a pre-determined range from, e.g., does not match, etc., a pre-determined value of the parameter stored within the memory device 406, and upon determining so, accesses from the memory device 406 a correspondence, e.g., a row listing within a table, a one-to-one relationship, an association, a mapping, etc., among a pre-determined amount of change to the multiplier applied by the frequency multiplier 108, a pre-determined amount of change to the amplitude achieved by the amplitude adjuster 110, a pre-determined amount of change to the phase achieved by the phase adjuster 112, a pre-determined amount of change to the amplitude achieved by the amplitude adjuster 120, a pre-determined amount of change to the multiplier applied by the frequency multiplier 122, a pre-determined amount of change to the amplitude achieved by the amplitude adjuster 124, and/or a pre-determined amount of change to the phase achieved by the phase adjuster 126 so that, e.g., until, etc., the measured parameter is changed to be within the pre-determined range from the pre-determined value of the parameter stored within the memory device 406. The processor 404 adjusts the multiplier applied by the frequency multiplier 108 to achieve the pre-determined amount of change, and/or adjusts the amplitude achieved by the amplitude adjuster 110 to achieve the pre-determined amount of change, and/or adjusts the phase achieved by the phase adjuster 112 to achieve the pre-determined amount of change, and/or adjusts the amplitude achieved by the amplitude adjuster 120 to achieve the pre-determined amount of change, and/or adjusts the multiplier applied by the frequency multiplier 122 to achieve the pre-determined amount of change, and/or adjusts the amplitude achieved by the amplitude adjuster 124 to achieve the pre-determined amount of change, and/or adjusts the phase achieved by the phase adjuster 126 to achieve the pre-determined amount of change so that the measured parameter is changed to be within the pre-determined range from the pre-determined value of the parameter stored within the memory device 406.

After applying the pre-determined amount of changes to the frequency multiplier 108, the amplitude adjuster 110, the phase adjuster 112, the amplitude adjuster 120, the frequency multiplier 122, the amplitude adjuster 124, and/or the phase adjuster 126, the adder 118 adds RF signals received via the RF cables 134, 138, and 146 to output an added signal via the RF transmission line 118 to the electrode of the plasma chamber 116. The added signal changes the ion flux within the plasma chamber 116 so that the ion flux within the plasma chamber 116, e.g., the measured parameter, etc., is within the pre-determined range from the pre-determined value of the parameter stored within the memory device 406.

Similarly, the DC bias probe 414 senses a DC bias voltage of a component within the plasma chamber 116 to generate an electrical signal and the DC bias voltage is induced by RF power of the plasma in the plasma chamber 116. The electrical signal is sent via the Cable 424 to the DC bias sensor 412, which measures the DC bias voltage based on the electrical signal. An amount of the measured DC bias voltage is sent as data from the DC bias sensor 412 via the transfer cable 426 to the processor 404 of the controller 208.

The processor 404 determines that the measured DC bias voltage is not within a pre-determined range from, e.g., does not match, etc., a pre-determined value of a DC bias voltage stored within the memory device 406, and upon determining so, accesses the memory device 406 to access a correspondence, e.g., a row listing within a table, a one-to-one relationship, an association, a mapping, etc., among a pre-determined amount of change to the multiplier applied by the frequency multiplier 108, a pre-determined amount of change to the amplitude achieved by the amplitude adjuster 110, a pre-determined amount of change to the phase achieved by the phase adjuster 112, a pre-determined amount of change to the amplitude achieved by the amplitude adjuster 120, a pre-determined amount of change to the multiplier applied by the frequency multiplier 122, a pre-determined amount of change to the amplitude achieved by the amplitude adjuster 124, and/or a pre-determined amount of change to the phase achieved by the phase adjuster 126 so that, e.g., until, etc., the measured DC bias voltage is changed to be within the pre-determined range from the pre-determined value of the DC bias voltage stored within the memory device 406. The processor 404 adjusts the multiplier applied by the frequency multiplier 108 to achieve the pre-determined amount of change, and/or adjusts the amplitude achieved by the amplitude adjuster 110 to achieve the pre-determined amount of change, and/or adjusts the phase achieved by the phase adjuster 112 to achieve the pre-determined amount of change, and/or adjusts the amplitude achieved by the amplitude adjuster 120 to achieve the pre-determined amount of change, and/or adjusts the multiplier applied by the frequency multiplier 122 to achieve the pre-determined amount of change, and/or adjusts the amplitude achieved by the amplitude adjuster 124 to achieve the pre-determined amount of change, and/or adjusts the phase achieved by the phase adjuster 126 to achieve the pre-determined amount of change so that the measured DC bias voltage is changed to be within the pre-determined range from the pre-determined value of the DC bias voltage stored within the memory device 406.

After applying the pre-determined amount of changes to the frequency multiplier 108, the amplitude adjuster 110, the phase adjuster 112, the amplitude adjuster 120, the frequency multiplier 122, the amplitude adjuster 124, and/or the phase adjuster 126, the adder 118 adds RF signals received via the RF cables 134, 138, and 146 to output an added signal via the RF transmission line 118 to the electrode of the plasma chamber 116. The added signal changes the ion flux within the plasma chamber 116 so that the DC bias voltage within the plasma chamber 116, e.g., the measured DC bias voltage, etc., is within the pre-determined range from the pre-determined value of the DC bias voltage stored within the memory device 406.

In various embodiments, either the ion flux within the plasma chamber 116 or the DC bias voltage within the plasma chamber 116 is adjusted by controlling the frequency multiplier 108, the amplitude adjuster 110, the phase adjuster 112, the amplitude adjuster 120, the frequency multiplier 122, the amplitude adjuster 124, and/or the phase adjuster 126.

In some embodiments, the processor 404 is coupled to a frequency multiplier via a motor and a connection mechanism, e.g., one or more rods, a combination of two or more rods and one or more gears, etc. The processor 404 is connected to the motor via a driver, e.g., one or more transistors, etc. The processor 404 sends a control signal to the driver and upon receiving the control signal, the driver generates a current signal. The control signal includes an amount of current that is stored within the correspondence stored in the memory device 406 and the amount of current corresponds to a pre-determined amount of change to a multiplier applied by the frequency multiplier. Upon receiving the current signal, a stator of the motor generates an electric field. When the electric field is generated, a rotor of the motor rotates to rotate the connection mechanism and the rotation of the connection mechanism changes a distance between plates of a capacitor of the frequency multiplier and/or an area between the plates to change a capacitance of the capacitor to further achieve the pre-determined amount of change to the multiplier applied by the frequency multiplier to further achieve the pre-determined value of the parameter.

Similarly, in various embodiments, the processor 404 is coupled to a phase adjuster via a motor and a connection mechanism. The processor 404 is connected to the motor via a driver. The processor 404 sends a control signal to the driver and upon receiving the control signal, the driver generates a current signal. The control signal includes an amount of current that is stored within the correspondence stored within the memory device 406 and the amount of current corresponds to a pre-determined amount of change to a phase achieved by the phase adjuster. Upon receiving the current signal, a rotor of the motor rotates to rotate the connection mechanism and the rotation of the connection mechanism changes a distance between plates of a capacitor of the phase adjuster and/or an area between the plates to change a capacitance of the capacitor to further achieve the pre-determined amount of change to the phase achieved by the phase adjuster to further achieve the pre-determined value of the parameter.

In some embodiments, the processor 404 is coupled to a gain control node of an amplitude adjuster via a cable. The processor 404 changes a voltage of a control signal applied to the gain control node to modify an amount of gain applied by the amplitude adjuster. The gain is applied to an amplitude of an RF signal that is received by the amplitude adjuster. In various embodiments, the processor 404 controls via a driver, e.g., one or more transistors, etc., a signal modulator that is coupled via a cable to the gain control node. The processor 404 sends a signal to the signal modulator to generate a modulating signal, which modulates an amplitude of the RF signal that is received by the amplitude adjuster.

Figure 5:
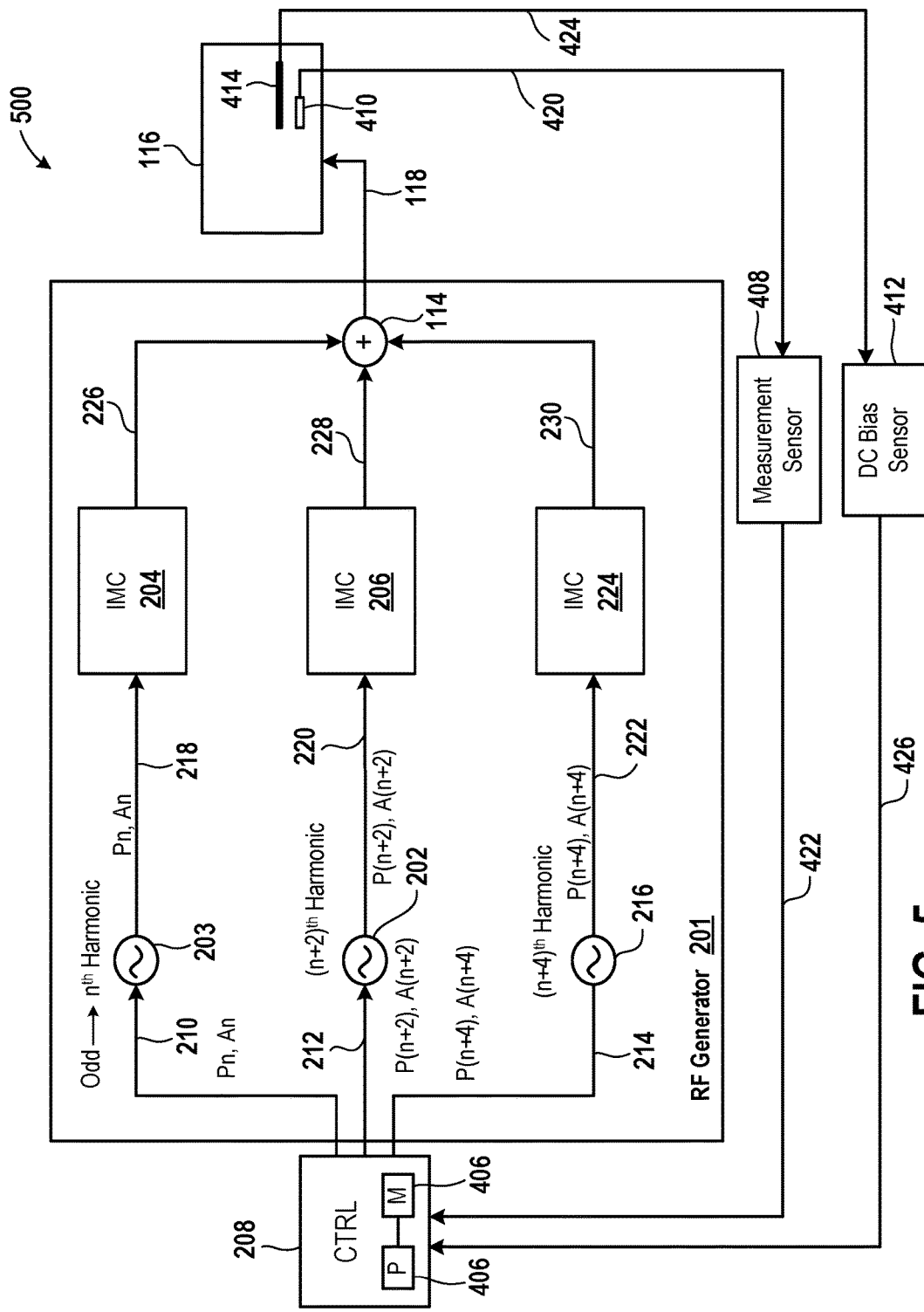
FIG. 5 is a diagram of an embodiment of a plasma system for illustrating feedback use of the one or more parameters to change a phase and/or an amplitude of an RF signal for controlling a process applied to the substrate.

FIG. 5 is a diagram of an embodiment of a system 500 for illustrating feedback use of the one or more parameters to change a phase and/or an amplitude of an RF signal for controlling a process applied to the substrate. The system 500 includes the system 200 (FIG. 2) and further includes the measurement sensor 408, the planar ion flux probe 410, the DC bias probe 414, and the DC bias sensor 412.

When the substrate is being processed within the plasma chamber 116, the measurement sensor 408 outputs the measured complex voltage or the measured complex current as data via the transfer cable 422 to the processor 404. The processor 404 determines that the measured parameter is not within the pre-determined range from, e.g., does not match, etc., the pre-determined value of the parameter stored within the memory device 406, and upon determining so, accesses from the memory device 406 a correspondence, e.g., a row listing within a table, a one-to-one relationship, an association, a mapping, etc., among a pre-determined amount of change to the phase Pn to be applied to the RF power supply 203, a pre-determined amount of change to the amplitude An to be applied to the RF power supply 203, a pre-determined amount of change to the phase P(n+2) to be applied to the RF power supply 202 a pre-determined amount of change to the amplitude A(n+2) to be applied to the RF power supply 202, a pre-determined amount of change to the phase P(n+4) to be applied to the RF power supply 216, and/or a pre-determined amount of change to the amplitude A(n+4) to be applied to the RF power supply 216 so that, e.g., until, etc., the measured parameter is changed to be within the pre-determined range from the pre-determined value of the parameter stored within the memory device 406.

The processor 404 provides via the transfer cable 210 a control signal including, e.g., indicating, etc., the pre-determined amount of change to the phase Pn and the pre-determined amount of change to the amplitude An to the RF power supply 203. Similarly, the processor 404 provides via the transfer cable 212 a control signal including the pre-determined amount of change to the phase P(n+2) and the pre-determined amount of change to the amplitude A(n+2) to the RF power supply 202. Moreover, similarly, the processor 404 provides via the transfer cable 214 a control signal including the pre-determined amount of change to the phase P(n+4) and the pre-determined amount of change to the amplitude A(n+4) to the RF power supply 216.

Upon receiving the pre-determined amount of changes to the phase Pn and the amplitude An, the RF power supply 203 generates the RF signal having the pre-determined amount of changes to the phase Pn and the amplitude An, and supplies the RF signal via the RF cable 218 to the IMC 204. Similarly, upon receiving the pre-determined amount of changes to the phase P(n+2) and the amplitude A(n+2), the RF power supply 202 generates the RF signal having the pre-determined amount of changes to the phase P(n+2) and the amplitude A(n+2), and supplies the RF signal via the RF cable 220 to the IMC 206. Moreover, similarly, upon receiving the pre-determined amount of changes to the phase P(n+4) and the amplitude A(n+4), the RF power supply 216 generates the RF signal having the pre-determined amount of changes to the phase P(n+4) and the amplitude A(n+4), and supplies the RF signal via the RF cable 222 to the IMC 224.

After the pre-determined amount of changes to the phases Pn, P(n+2), P(n+4), and to the amplitudes An, A(n+2), and A(n+4) are applied, the IMCs 204, 206, and 224 output to the adder 114 RF signals based on the pre-determined amount of changes. The adder 114 adds the RF signals output based on the pre-determined amount of changes received via the RF cables 226, 228, and 230 to output an added signal via the RF transmission line 118 to the electrode of the plasma chamber 116. The added signal changes the ion flux within the plasma chamber 116 so that the ion flux within the plasma chamber 116, e.g., the measured parameter, etc., is within the pre-determined range from the pre-determined value of the parameter stored within the memory device 406.

Similarly, the DC bias probe 414 senses the DC bias voltage of the component within the plasma chamber 116 to generate an electrical signal. Based upon the DC bias voltage sensed, the DC bias sensor 412 provides the measured DC bias voltage via the transfer cable 426 to the processor 404 of the controller 208.

The processor 404 accesses from the memory device 406 a correspondence, e.g., a row listing within a table, a one-to-one relationship, an association, a mapping, etc., among a pre-determined amount of change to the phase Pn to be applied to the RF power supply 203, a pre-determined amount of change to the amplitude An to be applied to the RF power supply 203, a pre-determined amount of change to the phase P(n+2) to be applied to the RF power supply 202 a pre-determined amount of change to the amplitude A(n+2) to be applied to the RF power supply 202, a pre-determined amount of change to the phase P(n+4) to be applied to the RF power supply 216, and/or a pre-determined amount of change to the amplitude A(n+4) to be applied to the RF power supply 216 so that the measured DC bias voltage is changed to be within a pre-determined range from a pre-determined value of the DC bias voltage stored within the memory device 406. As explained above, the processor 404 provides the pre-determined amount of change to the phase Pn to the RF power supply 203, the pre-determined amount of change to the amplitude An to the RF power supply 203, the pre-determined amount of change to the phase P(n+2) to the RF power supply 202, the pre-determined amount of change to the amplitude A(n+2) to the RF power supply 202, the pre-determined amount of change to the phase P(n+4) to the RF power supply 216, and/or the pre-determined amount of change to the amplitude A(n+4) to the RF power supply 216. The adder 114 receives via the RF cables 226, 228, and 230 the RF signals that are output by the IMCs 204, 206, and 224 based on the pre-determined amount of change to the phase Pn, the pre-determined amount of change to the phase P(n+2), the pre-determined amount of change to the phase P(n+4), the pre-determined amount of change to the amplitude An, the pre-determined amount of change to the amplitude A(n+2), and/or the pre-determined amount of change to the amplitude A(n+4) to output an added signal via the RF cable 118 to the electrode of the plasma chamber 116 for processing the substrate. The substrate is processed so that the DC bias voltage within the plasma chamber 116, e.g., the measured DC bias voltage, etc., is within the pre-determined range from the pre-determined value of the DC bias voltage stored within the memory device 406.

In various embodiments, either the ion flux within the plasma chamber 116 or the DC bias voltage within the plasma chamber 116 is adjusted by controlling the RF power supplies 203, 202, and 216.

Figure 6:
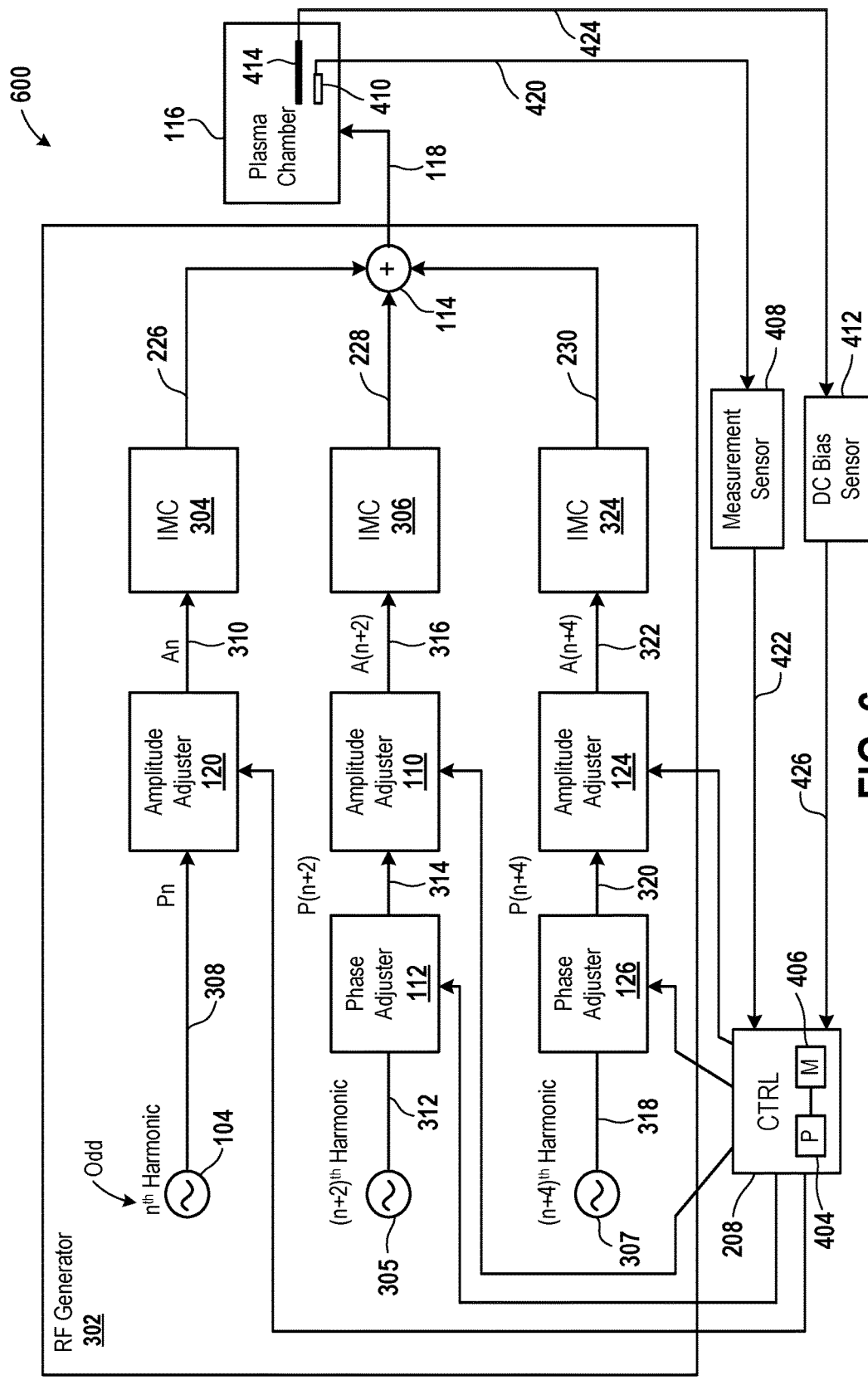
FIG. 6 is a diagram of another embodiment of a plasma system for illustrating feedback use of the one or more parameters to change a phase and/or an amplitude of an RF signal for controlling a process applied to the substrate.

FIG. 6 is a diagram of an embodiment of a system 600 to illustrate a control of the amplitude adjuster 120, the phase adjuster 112, the amplitude adjuster 110, the phase adjuster 126, and/or the amplitude adjuster 124 to change a phase and/or an amplitude of an RF signal for controlling a process applied to the substrate. The system 600 includes the system 300 (FIG. 3) and further includes the measurement sensor 408, the planar ion flux probe 410, the DC bias probe 414, the DC bias sensor 412, and the controller 208.

When the substrate is being processed within the plasma chamber 116, the planar ion flux probe 410 measures ion flux and the measurement sensor 408 outputs the measured complex voltage or the measured complex current as data via the transfer cable 422 to the processor 404. The processor 404 determines that the measured parameter is not within a pre-determined range from, e.g., does not match, etc., a pre-determined value of the parameter stored within the memory device 406, and upon determining so, accesses from the memory device 406 a correspondence, e.g., a row listing within a table, a one-to-one relationship, an association, a mapping, etc., among a pre-determined amount of change to the amplitude achieved by the amplitude adjuster 110, a pre-determined amount of change to the phase achieved by the phase adjuster 112, a pre-determined amount of change to the amplitude achieved by the amplitude adjuster 120, a pre-determined amount of change to the amplitude achieved by the amplitude adjuster 124, and a pre-determined amount of change to the phase achieved by the phase adjuster 126 so that, e.g., until, etc., the measured parameter is changed to be within a pre-determined range from a pre-determined value of the parameter stored within the memory device 406. The processor 404 adjusts the amplitude achieved by the amplitude adjuster 110 to achieve the pre-determined amount of change, adjusts the phase achieved by the phase adjuster 112 to achieve the pre-determined amount of change, adjusts the amplitude achieved by the amplitude adjuster 120 to achieve the pre-determined amount of change, adjusts the amplitude achieved by the amplitude adjuster 124 to achieve the pre-determined amount of change, and/or adjusts the phase achieved by the phase adjuster 126 to achieve the pre-determined amount of change so that the measured parameter is changed to be within the pre-determined range from the pre-determined value of the parameter stored within the memory device 406.

After applying the pre-determined amount of changes to the amplitude adjuster 110, the phase adjuster 112, the amplitude adjuster 120, the amplitude adjuster 124, and/or the phase adjuster 126, the adder 118 adds RF signals received via the RF cables 226, 228, and 230 to output an added signal via the RF transmission line 118 to the electrode of the plasma chamber 116. The added signal changes the ion flux within the plasma chamber 116 so that the ion flux within the plasma chamber 116, e.g., the measured parameter, etc., is within the pre-determined range from the pre-determined value of the parameter stored within the memory device 406.

Similarly, the DC bias probe 414 senses a DC bias voltage of the component within the plasma chamber 116 to generate an electrical signal and an amount of the measured DC bias voltage is sent as data from the DC bias sensor 412 via the transfer cable 426 to the processor 404 of the controller 208. The processor 404 determines that the measured DC bias voltage is not within a pre-determined range from, e.g., does not match, etc., a pre-determined value of a DC bias voltage stored within the memory device 406, and upon determining so, accesses the memory device 406 to access a correspondence, e.g., a row listing within a table, a one-to-one relationship, an association, a mapping, etc., among a pre-determined amount of change to the amplitude achieved by the amplitude adjuster 110, a pre-determined amount of change to the phase achieved by the phase adjuster 112, a pre-determined amount of change to the amplitude achieved by the amplitude adjuster 120, a pre-determined amount of change to the amplitude achieved by the amplitude adjuster 124, and/or a pre-determined amount of change to the phase achieved by the phase adjuster 126 so that the measured DC bias voltage is changed to be within the pre-determined range from the pre-determined value of the DC bias voltage stored within the memory device 406. The processor 404 adjusts the adjusts the amplitude achieved by the amplitude adjuster 110 to achieve the pre-determined amount of change, and/or adjusts the phase achieved by the phase adjuster 112 to achieve the pre-determined amount of change, and/or adjusts the amplitude achieved by the amplitude adjuster 120 to achieve the pre-determined amount of change, and/or adjusts the amplitude achieved by the amplitude adjuster 124 to achieve the pre-determined amount of change, and/or adjusts the phase achieved by the phase adjuster 126 to achieve the pre-determined amount of change so that the measured DC bias voltage is changed to be within the pre-determined range from the pre-determined value of the DC bias voltage stored within the memory device 406.

After applying the pre-determined amount of changes to the amplitude adjuster 110, the phase adjuster 112, the amplitude adjuster 120, the amplitude adjuster 124, and/or the phase adjuster 126, the adder 118 adds RF signals received via the RF cables 226, 228, and 230 to output an added signal via the RF transmission line 118 to the electrode of the plasma chamber 116. The added signal changes the ion flux within the plasma chamber 116 so that the DC bias voltage within the plasma chamber 116, e.g., the measured DC bias voltage, etc., is within the pre-determined range from the pre-determined value of the DC bias voltage stored within the memory device 406.

In various embodiments, either the ion flux within the plasma chamber 116 or the DC bias voltage within the plasma chamber 116 is adjusted by controlling the amplitude adjuster 110, the phase adjuster 112, the amplitude adjuster 120, the amplitude adjuster 124, and/or the phase adjuster 126.

In some embodiments, the methods described above with reference to FIGS. 4-6 are performed before processing the substrate.

Figure 7:
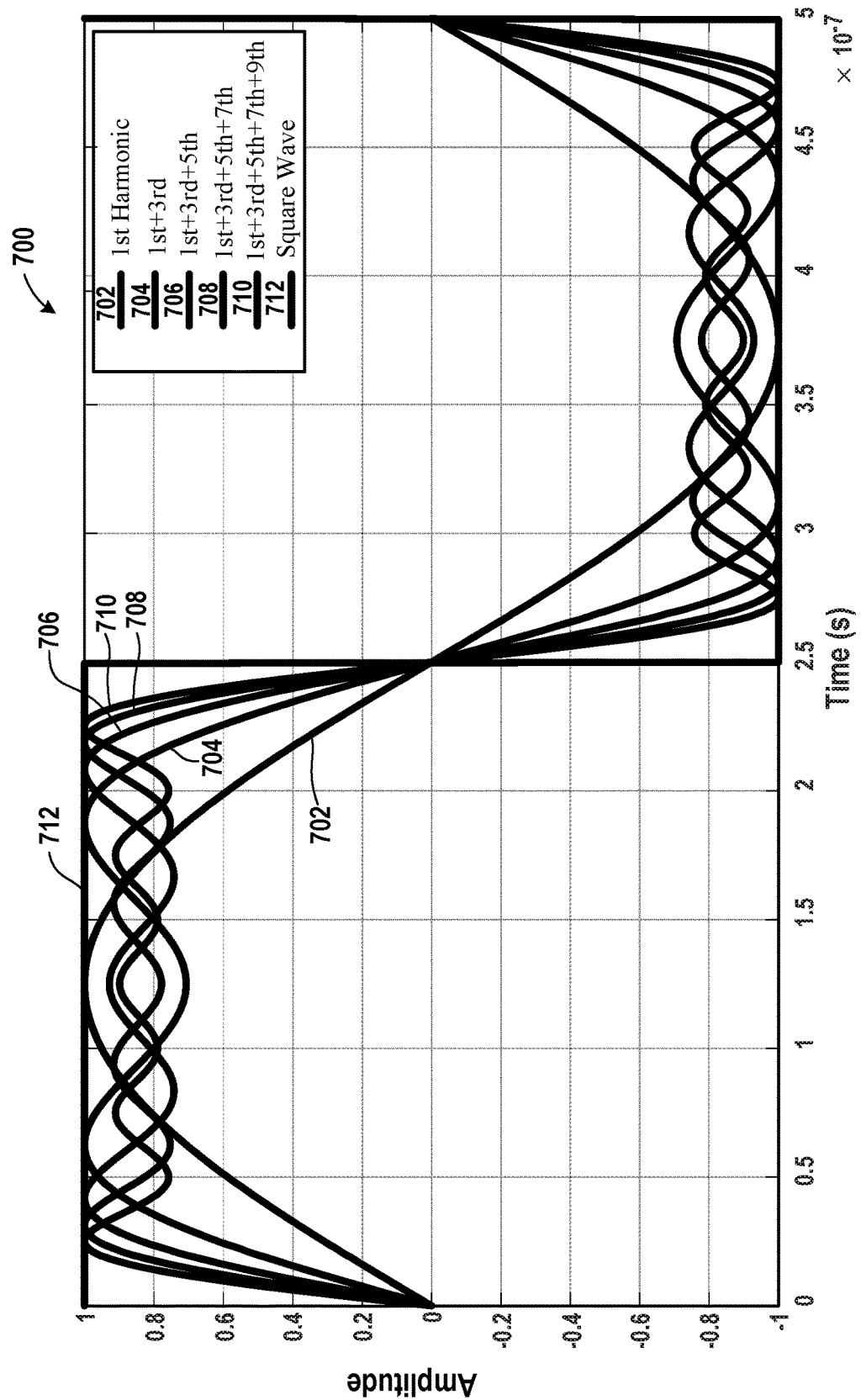
FIG. 7 is an embodiment of a graph to illustrate that multiple odd harmonics are combined to generate an RF signal waveform close to square waveform.

FIG. 7 is an embodiment of a graph 700 to illustrate that multiple odd harmonics, e.g., a $1^{st}$ harmonic waveform 702, the 3$^{rd}$ harmonic waveform, the 5$^{th}$ harmonic waveform, etc., are combined, e.g., added, summed, etc., to generate an RF signal having an amplitude, e.g., RMS value, peak-to-peak amplitude, etc., which is a square waveform 712. For example, the 1$^{st}$ harmonic waveform 702 is combined with, e.g., added to, etc., the 3$^{rd}$ harmonic waveform to generate an amplitude waveform 704, which is an approximation of the square waveform 712. Similarly, as another example, the 1$^{st}$ harmonic waveform 702 is combined with, e.g., added to, etc., the 3$^{rd}$ harmonic waveform and the 5$^{th}$ harmonic waveform to generate an amplitude waveform 706, which is another approximation of the square waveform 712. To illustrate, the added signal that is output from the adder 114 of FIG. 1, FIG. 2, or FIG. 3 has an amplitude represented by the amplitude waveform 706. In some embodiments, an added signal that is output from the adder 114 of FIG. 1, 2, or 3 has an amplitude represented by the amplitude waveform 704. In these embodiments, the added signal is a sum of RF signals received via the RF cables 134 and 138 (FIG. 1) or of RF signals received via the RF cables 226 and 228 (FIG. 2 or 3). The square waveform 712 is a digital pulse that is an amplitude, e.g., RMS value, peak-to-peak amplitude, etc., of an RF signal generated by an RF generator. The RF signal generated by the RF generator is in some embodiments, sinusoidal in shape.

Moreover, similarly, as another example, the 1$^{st}$ harmonic waveform 702 is combined with, e.g., added to, etc., the 3$^{rd}$ harmonic waveform, the 5$^{th}$ harmonic waveform, and a 7$^{th}$ harmonic waveform to generate an amplitude waveform 708, which is yet another approximation of the square waveform 712. Similarly, as another example, the 1$^{st}$ harmonic waveform 702 is combined with, e.g., added to, etc., the 3$^{rd}$ harmonic waveform, the 5$^{th}$ harmonic waveform, the 7$^{th}$ harmonic waveform, and a 9$^{th}$ harmonic waveform to generate an amplitude waveform 710, which is another approximation of the square waveform 712. The graph 700 plots an amplitude of an amplitude waveform versus time.

It should be noted that the approximation provided by the amplitude waveform 710 is better than the approximation provided by the amplitude waveform 708. Moreover, the approximation provided by the amplitude waveform 708 is better than the approximation provided by the amplitude waveform 706 and the approximation provided by the amplitude waveform 706 is better than the approximation provided by the amplitude waveform 704. For example, an amplitude, e.g., RMS value, peak-to-peak amplitude, etc., illustrated by the amplitude waveform 710 is within a pre-set range from an amplitude illustrated by the square waveform 712 for a greater amount of time during a pulse of the square waveform 712 than an amount of time for which an amplitude represented by the amplitude waveform 708 is within the pre-set range from the amplitude illustrated by the square waveform 712. As another example, an amplitude illustrated by the amplitude waveform 708 is within the pre-set range from the amplitude illustrated by the square waveform 712 for a greater amount of time during a pulse of the square waveform 712 than an amount of time for which an amplitude represented by the amplitude waveform 706 is within the pre-set range from the amplitude illustrated by the square waveform 712. As yet another example, an amplitude illustrated by the amplitude waveform 706 is within the pre-set range from the amplitude illustrated by the square waveform 712 for a greater amount of time during a pulse of the square waveform 712 than an amount of time for which an amplitude represented by the amplitude waveform 704 is within the pre-set range from the amplitude illustrated by the square waveform 712. As an example, an amplitude illustrated by the amplitude waveform 704 is within the pre-set range from an amplitude illustrated by the square waveform 712 for a greater amount of time during a pulse of the square waveform 712 than an amount of time for which an amplitude represented by the 1$^{st}$ harmonic waveform 702 is within the pre-set range from the amplitude illustrated by the square waveform 712.

Each of the amplitude waveforms 702, 704, 706, 708, and 710 is an example of an amplitude, e.g., RMS value, peak-to-peak amplitude, etc., of an added signal that is output from the adder 114 (FIGS. 1-6).

In some embodiments, the square waveform 712 is represented by an equation:

$$x_{square}(t) = \frac{4}{\pi}\sum_{k=1}^{\infty}\left(\frac{\sin(2\pi(2k-1)ft)}{(2k-1)}\right) = \qquad \text{equation (1)}$$
$$\frac{4}{\pi}\left(\sin(2\pi ft) + \frac{1}{3}\sin(6\pi ft) + \frac{1}{5}\sin(10\pi ft) + \dots \right)$$

where t is time, and f is frequency of an RF signal, e.g., sinusoidal waveform, etc., having an amplitude. It should be noted that as illustrated, in some embodiments, the equation (1) is an infinite series and the square waveform 712 has an amplitude of 1. In various embodiments, the equation (1) converges to have the square waveform 712 as an amplitude. Moreover, the square waveform 712 contains components of odd-integer harmonic frequencies of a form 4 sin(2π(2k−1)ft)/π(2k−1). For example, the first harmonic waveform is represented as 4 sin(2πft)/π, the third harmonic waveform is represented as 4 sin(6πft)/3π, and the fifth harmonic waveform is represented as 4 sin(10πft)/5π. To illustrate, the representation 4 sin(2πft)/π is a representation of the RF signal received by the adder 114 via the RF cable 138 (FIG. 1), or the RF cable 226 of FIG. 2, or the RF cable 226 of FIG. 3. As another illustration, the representation 4 sin(6πft)/3π is a representation of the RF signal received by the adder 114 via the RF cable 134 (FIG. 1) or the RF cable 228 of FIG. 2, or the RF cable 228 of FIG. 3. As yet another illustration, the representation 4 sin(10πft)/5π is a representation of the RF signal received by the adder 114 via the RF cable 146 (FIG. 1) or the RF cable 230 of FIG. 2, or the RF cable 230 of FIG. 3. As another example, the square waveform 712 includes a sum of the RF signals received via the RF cables 134, 138, and 146 (FIG. 1) by the adder 114. As yet another example, the square waveform 712 includes a sum of the RF signals received via the RF cables 226, 228, and 230 (FIG. 2) by the adder 114. As another example, the square waveform 712 includes a sum of the RF signals received via the RF cables 226, 228, and 230 (FIG. 3) by the adder 114. The square waveform 712 does not contain any components of even-integer harmonic frequencies.

It should be noted that a difference between an amplitude represented by the square wave form 712 and an amplitude represented by any of the amplitude waveforms 704, 706, 708, and 710 is less than 0.5. In some embodiments, a difference between an amplitude represented by the square wave form 712 and an amplitude represented by any of the amplitude waveforms 704, 706, 708, and 710 is less than 0.7.

Figure 8A:
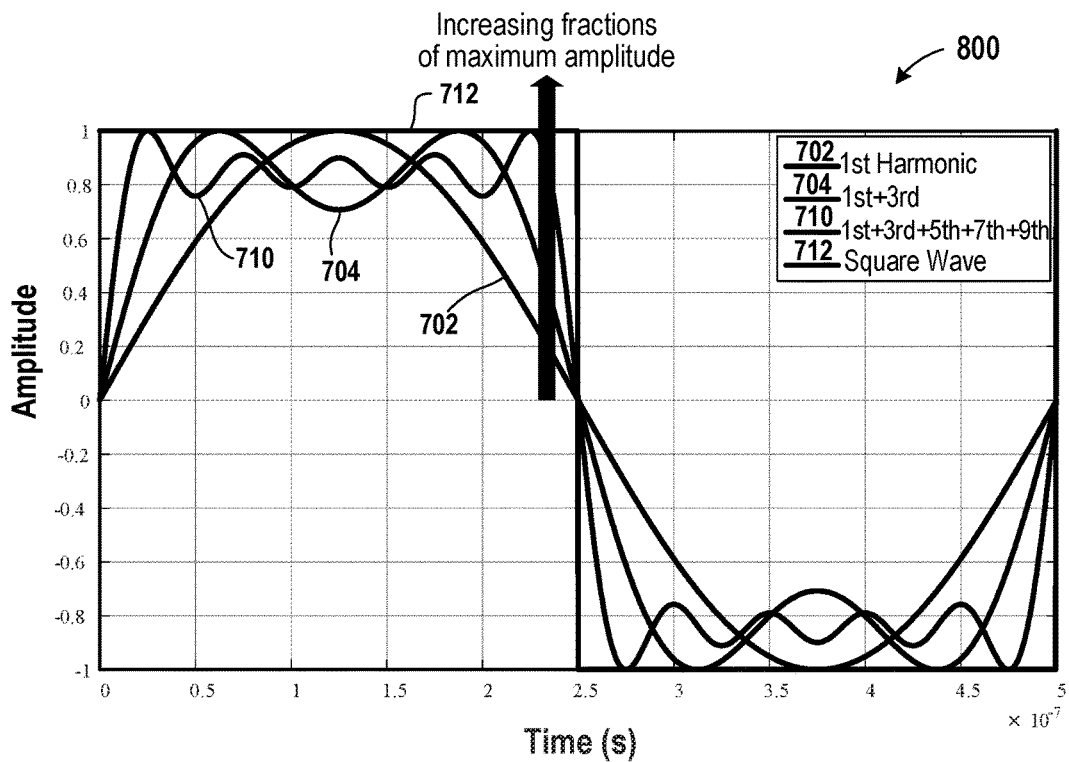
FIG. 8A is an embodiment of a graph to illustrate waveforms of combined odd harmonics of FIG. 7.

FIG. 8A is an embodiment of a graph 800 to illustrate the amplitude waveforms 702, 704, 710, and 712. The graph 800 plots an amplitude of an amplitude waveform versus time. The graph 800 is similar to the graph 700 except that the graph 800 excludes the amplitude waveforms 706 and 708.

Figure 8B:
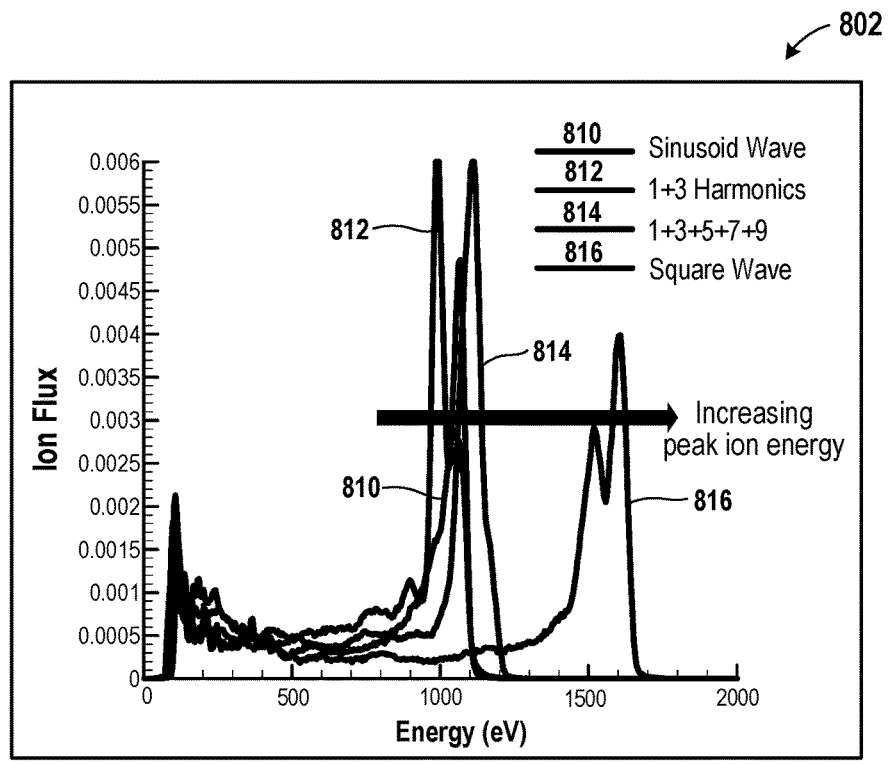
FIG. 8B is an embodiment of a graph to illustrate a change in ion flux and ion energy within the plasma chamber with a change in a number of odd harmonics that are combined to generate an added signal.

FIG. 8B is an embodiment of a graph 802 to illustrate a change in ion flux and ion energy within the plasma chamber 116 with a change in a number of odd harmonics that are combined to generate an added signal. The graph 802 plots ion flux within the plasma chamber 116 versus ion energy, measured in electron volts (eV). The ion energy is directly proportional to DC bias voltage within the plasma chamber 116. For example, with an increase in the DC bias voltage within the plasma chamber 116, there is an increase in the averaged ion energy within the plasma chamber 116 and with a decrease in the DC bias voltage within the plasma chamber 116, there is a decrease in the averaged ion energy within the plasma chamber 116.

As shown in the graph 802, with an increase in a number of odd harmonic waveforms that are combined, there is an increase in an amount of peak ion energy. For example, a plot 810 represents ion energy, e.g., a peak ion energy, etc., when a sinusoid wave, e.g., the $1^{st}$ harmonic waveform 702, etc., is supplied as an added signal from the adder 114 (FIG. 1, 2 or 3) to the plasma chamber 116 (FIG. 1, 2 or 3). Moreover, another plot 812 represents ion energy, e.g., a peak ion energy, etc., when an added signal supplied from the adder 114 to the plasma chamber 116 has an amplitude represented by the amplitude waveform 704. Furthermore, another plot 814 represents ion energy, e.g., a peak ion energy, etc., when an added signal supplied from the adder 114 to the plasma chamber 116 has an amplitude represented by the amplitude waveform 710. Another plot 816 represents ion energy, e.g., a peak ion energy, etc., when an added signal supplied from the adder 114 to the plasma chamber 116 has an amplitude represented by the square waveform 712. As shown in the graph 800, the ion energy, e.g. a peak ion energy, etc., within the plasma chamber 116 is greater when an added signal having an amplitude represented by the amplitude waveform 710 or the amplitude waveform 704 is supplied by the adder 114 to the plasma chamber 116 compared to ion energy, e.g. a peak ion energy, etc., within the plasma chamber 116 when an added signal having an amplitude represented by the waveform 702 is supplied to the plasma chamber 116.

Figure 9:
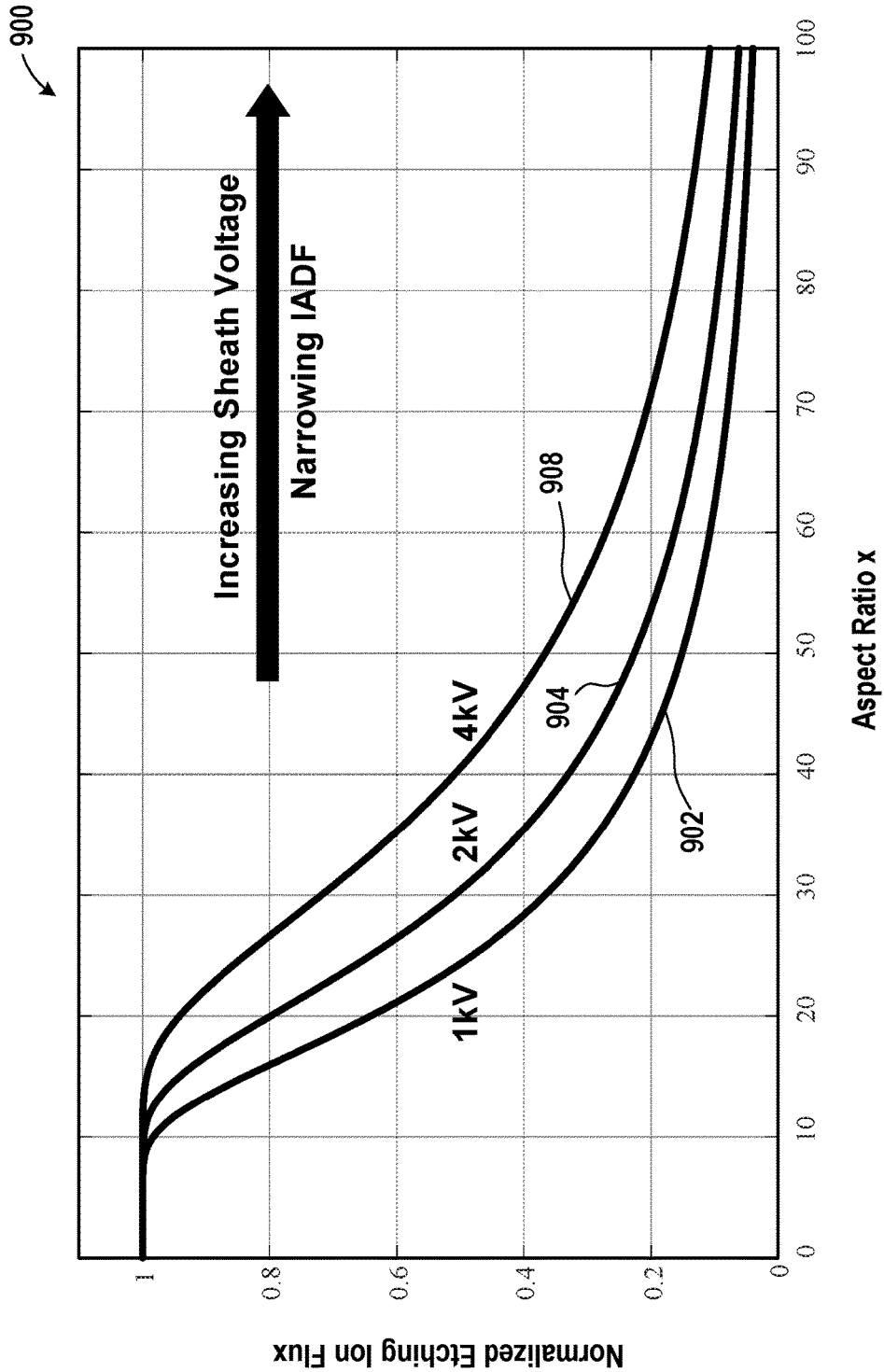
FIG. 9 is an embodiment of a graph to illustrate that ion flux within the plasma chamber and ion energy within the plasma chamber are controlled to enable aspect ratio dependent etching of features within the substrate.

FIG. 9 is an embodiment of a graph 900 to illustrate that ion flux within the plasma chamber 116 and ion energy within the plasma chamber 116 are controlled to enable aspect ratio dependent etching of features within the substrate. The graph 900 plots a normalized ion flux versus aspect ratio of etched features. The graph 900 has plots 902, 904, and 908. The plot 902 is plotted when a plasma sheath voltage of plasma within the plasma chamber 116 is 1 kilovolts (kV). Similarly, the plot 904 is plotted when a plasma sheath voltage of plasma within the plasma chamber 116 is 2 kV and the plot 906 is plotted when a plasma sheath voltage of plasma within the plasma chamber 116 is 4 kV.

It should be noted that the plasma sheath voltage is controlled to obtain the desired ion energy and ion flux within the plasma chamber 116 for etching high aspect ratio features. Moreover, with an increase in the plasma sheath voltage, an ion angular distribution function (IADF) is narrowed to enable etching of high aspect ratio features.

FIG. 10A is a diagram of an embodiment of a capacitively coupled plasma (CCP) chamber 1000, which is an example of the plasma chamber 116 (FIGS. 1-6). The CCP chamber 1000 includes a chuck 1004 and an upper electrode 1006. The upper electrode 1006 faces the chuck 1004 and is grounded, e.g., coupled to a reference voltage, coupled to zero voltage, coupled to a negative voltage, etc. Examples of the chuck 1004 include an electrostatic chuck (ESC) and a magnetic chuck. A lower electrode of the chuck 1004 is made of a metal, e.g., anodized aluminum, alloy of aluminum, etc. In various embodiments, the lower electrode of the chuck 1004 is a thin layer of metal that is covered by a layer of ceramic. Also, the upper electrode 1006 is made of a metal, e.g., aluminum, alloy of aluminum, etc. In some embodiments, the upper electrode 1006 is made from silicon. The upper electrode 1006 is located opposite to and facing the lower electrode of the chuck 1004.

A wafer 1002 is placed on a top surface 1008 of the chuck 1004 for processing, e.g., depositing materials on the wafer 1002, or cleaning the wafer 1002, or etching layers deposited on the wafer 1002, or doping the wafer 1002, or implanting ions on the wafer 1002, or creating a photolithographic pattern on the wafer 1002, or etching the wafer 1002, or sputtering the wafer 1002, or a combination thereof, etc., using plasma generated and maintained within the CCP chamber 1000. When an added signal from the adder 114 (FIG. 1, 2, or 3) is supplied via the RF cable 118 to the lower electrode of the chuck 1004 and one or more process gases, e.g., oxygen containing gas, fluorine containing gas, etc., are supplied via openings in the upper electrode 1006 into a gap between the upper electrode 1006 and the chuck 1004, plasma is generated or maintained within the CCP chamber 1000, and the wafer 1002 is processed by the plasma.

In several embodiments, instead of the upper electrode 1006 being coupled to ground, the upper electrode 1006 is supplied with an RF signal from one or more RF generators coupled to the upper electrode 1006 while the chuck 1004 is provided an added signal from the adder 114. In some embodiments, the upper electrode 1006 is supplied an added signal from the adder 114 via the RF cable 118. The RF cable 118 is coupled to the upper electrode 1006 instead of the chuck 1004, and the chuck 1004 is coupled to ground. In various embodiments, both the upper electrode 1006 and the chuck 1004 are provided added signals from different adders. For example, the chuck 1004 is supplied an added signal from the adder 114 and similarly, the upper electrode 1006 is supplied an added signal from another adder (not shown), which is similar in structure and function to the adder 114. The other adder (not shown) is a part of another RF generator, which is similar in structure and function to the RF generator 102 (FIG. 1), or the RF generator 201 (FIG. 2), or the RF generator 302 (FIG. 3).

In some embodiments, the CCP chamber 1000 is formed using additional parts, e.g., an upper electrode extension that surrounds the upper electrode 1006, a lower electrode extension that surrounds the lower electrode of the chuck 1004, a dielectric ring between the upper electrode 1006 and the upper electrode extension, a dielectric ring between the lower electrode and the lower electrode extension, confinement rings located at edges of the upper electrode 1006 and the chuck 1004 to surround a region within the CCP chamber 1000 in which plasma is formed, etc.

In various embodiments, an RF signal supplied to the upper electrode 1006 is referred to herein as a source RF signal and has a source frequency and an RF signal supplied to the chuck 1004 is referred to herein as a bias RF signal and has a bias frequency. The source RF signal is used to generate or maintain plasma, and the bias RF signal is used to control an amount of ion flux and/or ion energy of the plasma to control processing, e.g., etching, deposition, etc., of the wafer 1002.

FIG. 10B is a diagram of an embodiment of an inductively coupled plasma (ICP) chamber 1010, which is an example of the plasma chamber 116 (FIGS. 1-6). The ICP chamber 1010 includes an inductive coil 1012 and the chuck 1004. The inductive coil 1012 is separated from a housing 1016 of the ICP chamber 1010 by a dielectric window 1014. One or more RF power supplies supply power to the inductive coil 1012 in conjunction with a supply of the one or more process gases within the housing 1016 to generate or maintain plasma within the ICP chamber 1010 to process the wafer 1002 using the plasma.

In some embodiments, any number of inductive coils are located above the dielectric window 1014 instead of one. In various embodiments, the inductive coil 1012 is supplied an added signal from the adder 114 (FIG. 1, 2, or 3) via the RF cable 118. The RF cable 118 is coupled to the inductive coil 1012 instead of the chuck 1004, and the chuck 1004 is coupled to ground or is provided an RF signal from one or more RF power supplies coupled to the chuck 1004.

In various embodiments, both the inductive coil 1012 and the chuck 1004 are provided added signals from different adders. For example, the chuck 1004 is supplied an added signal from the adder 114 and similarly, the inductive coil 1012 is supplied an added signal from another adder (not shown), which is similar in structure and function to the adder 114. The other adder (not shown) is a part of another RF generator, which is similar in structure and function to the RF generator 102 (FIG. 1), or the RF generator 201 (FIG. 2), or the RF generator 302 (FIG. 3).

In various embodiments, an RF signal supplied to the inductive coil 1012 is referred to herein as a source RF signal and has a source frequency and an RF signal supplied to the chuck 1004 is referred to herein as a bias RF signal and has a bias frequency.

FIG. 10C is a diagram of an embodiment of an electron cyclotron resonance (ECR) plasma chamber 1020, which is an example of the plasma chamber 116 (FIGS. 1-6). The ECR plasma chamber 1020 includes microwave generator 1022, a microwave feeding hole 1028, a housing 1026, and an inductive coil 1024. The microwave feeding hole 1028 is sealed with a microwave feeding window 1030 and is connected to a lower end of a wave guide 1032 at the microwave feeding window 1030. An upper part of the wave guide 1032 is connected with the microwave generator 1022. Moreover, a gas feeding pipe 1034 is coupled to an opening in the housing 1026. The inductive coil 1024 is coaxially placed around the lower end of wave guide 1024.

The one or more process gases are fed into the housing 1026 through the gas feeding pipe 1034. Moreover, the inductive coil 1024 is supplied with an RF signal from one or more RF power supplies to create a magnetic field within the housing 1026. Also, the microwave generator 1022 generates microwaves and introduces the microwaves through the wave guide 1032 and microwave feeding window 1030 into the housing 1026. Plasma is then formed as a result of a resonance excitation initiated in the one or more process gases by the microwaves. The plasma generated is transported and brought into contact with the wafer 1002 placed on the chuck 1004 by a force of an electric field that is created by the supply of RF signal to the inductive coil 1024 and that is created by the supply of an added signal to the chuck 1004 to process the wafer 1002.

In various embodiments, the microwaves generated by the microwave generator 1002 is referred to herein as a source signal and has a source frequency and an RF signal supplied to the chuck 1004 is referred to herein as a bias RF signal and has a bias frequency.

In some embodiments, any number of inductive coils are located above and/or adjacent to the housing 1026 instead of one. In various embodiments, the inductive coil 1024 is supplied an added signal from the adder 114 via the RF cable 118. The RF cable 118 is coupled to the inductive coil 1012 instead of the chuck 1004, and the chuck 1004 is coupled to ground or is provided an RF signal from one or more RF power supplies.

In various embodiments, both the inductive coil 1024 and the chuck 1004 are provided added signals from different adders. For example, the chuck 1004 is supplied an added signal from the adder 114 and similarly, the inductive coil 1024 is supplied an added signal from another adder (not shown), which is similar in structure and function to the adder 114. The other adder (not shown) is a part of another RF generator, which is similar in structure and function to the RF generator 102 (FIG. 1), or the RF generator 201 (FIG. 2), or the RF generator 302 (FIG. 3).

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to various types of plasma chambers, e.g., a plasma chamber including an ICP reactor, a transformer coupled plasma (TCP) reactor, conductor tools, dielectric tools, a plasma chamber including an ECR reactor, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A system comprising:
  a radiofrequency (RF) generator including:
    an odd harmonic power supply configured to generate an $n^{th}$ harmonic RF signal, wherein n is an odd number;
    an impedance matching circuit coupled to the odd harmonic power supply, wherein the impedance matching circuit is configured to output an $n^{th}$ modified harmonic RF signal upon receiving the $n^{th}$ harmonic RF signal;
    a frequency multiplier coupled to the impedance matching circuit, wherein the frequency multiplier is configured to receive the $n^{th}$ modified harmonic RF signal to output an $(n+2)^{th}$ harmonic RF signal;
    a variable adjuster coupled to the frequency multiplier, wherein the variable adjuster is configured to modify a variable of the $(n+2)^{th}$ harmonic RF signal to output an adjusted $(n+2)^{th}$ harmonic RF signal;
    an adder coupled to the variable adjuster and the impedance matching circuit, wherein the adder is configured to add the $n^{th}$ modified harmonic RF signal and the adjusted $(n+2)^{th}$ harmonic RF signal to provide an added RF signal; and a plasma chamber coupled to the RF generator, wherein the plasma chamber is configured to receive the added RF signal from the adder to provide power to an electrode within the plasma chamber.

2. The system of claim 1, wherein the adder is configured to add the $n^{th}$ modified harmonic RF signal and the adjusted $(n+2)^{th}$ harmonic RF signal to generate an approximation of a square wave pulse, wherein the square wave pulse is a digital pulse that is a root mean square of an RF signal generated by the RF generator.

3. The system of claim 2, wherein the square wave pulse is an amplitude of a sum of odd harmonic waveforms including the $n^{th}$ modified harmonic RF signal and the adjusted $(n+2)^{th}$ harmonic RF signal.

4. The system of claim 1, further comprising:
a controller coupled to the variable adjuster,
wherein the controller is configured to determine measured ion flux of ions within the plasma chamber, wherein the controller is configured to determine whether the measured ion flux matches a predetermined ion flux,
wherein the controller includes a processor and a memory device,
wherein the processor is configured to access a predetermined variable value from the memory device based on a correspondence between the predetermined variable value and the predetermined ion flux,
wherein the controller is configured to provide the predetermined variable value to the variable adjuster,
wherein the variable adjuster is configured to adjust the variable of the $(n+2)^{th}$ harmonic RF signal to achieve the predetermined variable value to further achieve the predetermined ion flux.

5. The system of claim 1, wherein the $n^{th}$ harmonic RF signal is a first harmonic signal, wherein the $(n+2)^{th}$ harmonic RF signal is a third harmonic signal.

6. The system of claim 1, wherein the impedance matching circuit is configured to match an impedance of a load coupled to the impedance matching circuit with that of a source coupled to the impedance matching circuit to output the $n^{th}$ modified harmonic RF signal, wherein the plasma chamber is coupled to the adder via an RF transmission line.

7. The system of claim 1, wherein the variable is an amplitude of the $(n+2)^{th}$ harmonic RF signal.

8. A system comprising:
a radio frequency (RF) generator including:
a first odd harmonic RF power supply configured to generate an $n^{th}$ harmonic RF signal, wherein n is an odd number;
a second odd harmonic RF power supply configured to generate an $(n+2)^{th}$ harmonic RF signal;
a first impedance matching circuit coupled to the first odd harmonic RF power supply, wherein the first impedance matching circuit is configured to receive the $n^{th}$ harmonic RF signal to output an $n^{th}$ modified harmonic RF signal;
a second impedance matching circuit coupled to the second odd harmonic RF power supply, wherein the second impedance matching circuit is configured to receive the $(n+2)^{th}$ harmonic RF signal to output an $(n+2)^{th}$ modified harmonic RF signal;
an adder coupled to the first impedance matching circuit and the second impedance matching circuit, wherein the adder is configured to add the $n^{th}$ modified harmonic RF signal and the $(n+2)^{th}$ modified harmonic RF signal to output an added RF signal; and a plasma chamber coupled to the RF generator, wherein the plasma chamber is configured to receive the added RF signal from the adder for changing an impedance of plasma within the plasma chamber.

9. The system of claim 8, wherein the adder is configured to add the $n^{th}$ modified harmonic RF signal and the $(n+2)^{th}$ modified harmonic RF signal to generate an approximation of a square wave pulse, wherein the square wave pulse is a digital pulse that is a root mean square of an RF signal generated by the RF generator.

10. The system of claim 9, wherein the square wave pulse is an amplitude of a sum of odd harmonic waveforms including the $n^{th}$ modified harmonic RF signal and the $(n+2)^{th}$ modified harmonic RF signal.

11. The system of claim 8, further comprising a controller coupled to the first odd harmonic RF power supply and the second odd harmonic RF power supply,
wherein the controller is configured to determine measured ion flux of ions within the plasma chamber, wherein the controller is configured to determine whether the measured ion flux matches a predetermined ion flux,
wherein the controller includes a processor and a memory device,
wherein the processor is configured to access a predetermined variable value from the memory device based on a correspondence between the predetermined variable value and the predetermined ion flux,
wherein the controller is configured to supply a signal to the second odd harmonic RF power supply indicating the predetermined variable value,
wherein the second odd harmonic RF power supply is configured to adjust a variable of the $(n+2)^{th}$ harmonic RF signal to achieve the predetermined variable value to further achieve the predetermined ion flux.

12. The system of claim 8, wherein the $n^{th}$ harmonic RF signal is a first harmonic signal, wherein the $(n+2)^{th}$ harmonic RF signal is a third harmonic signal.

13. The system of claim 8, wherein the first impedance matching circuit is configured to match an impedance of a load coupled to the first impedance matching circuit with that of a source coupled to the first impedance matching circuit to output the $n^{th}$ modified harmonic RF signal, wherein the plasma chamber is coupled to the adder via an RF transmission line.

14. The system of claim 8, wherein the second impedance matching circuit is configured to match an impedance of a load coupled to the second impedance matching circuit with that of a source coupled to the second impedance matching circuit to output the $(n+2)^{th}$ modified harmonic RF signal.

15. A system comprising:
a radio frequency (RF) generator including:
a first odd harmonic RF power supply configured to generate an $n^{th}$ harmonic RF signal, wherein n is an odd number;
a second odd harmonic RF power supply configured to generate an $(n+2)^{th}$ harmonic RF signal;
a variable adjuster coupled to the second odd harmonic RF power supply, wherein the variable adjuster is configured to adjust a variable of the $(n+2)^{th}$ harmonic RF signal to output an adjusted $(n+2)^{th}$ harmonic RF signal;
a first impedance matching circuit coupled to the first odd harmonic RF power supply, wherein the first impedance matching circuit is configured to receive the $n^{th}$ harmonic RF signal for outputting an $n^{th}$ modified harmonic RF signal;

a second impedance matching circuit coupled to the variable adjuster, wherein the second impedance matching circuit is configured to receive the adjusted $(n+2)^{th}$ harmonic RF signal to output an $(n+2)^{th}$ modified harmonic RF signal;

an adder coupled to the first impedance matching circuit and the second impedance matching circuit, wherein the adder is configured to add the $n^{th}$ modified harmonic RF signal with the $(n+2)^{th}$ modified harmonic RF signal to output an added RF signal; and a plasma chamber coupled to the RF generator, wherein the plasma chamber is configured to receive the added RF signal to modify an impedance of plasma within the plasma chamber.

16. The system of claim 15, wherein the adder is configured to add the $n^{th}$ modified harmonic RF signal with the $(n+2)^{th}$ modified harmonic RF signal to generate an approximation of a square wave pulse, wherein the square wave pulse is a digital pulse that is a root mean square of an RF signal generated by the RF generator.

17. The system of claim 16, wherein the square wave pulse is an amplitude of a sum of odd harmonic waveforms including the $n^{th}$ modified odd harmonic RF signal and the $(n+2)^{th}$ modified harmonic RF signal.

18. The system of claim 15, further comprising:
a controller coupled to the variable adjuster,
wherein the controller is configured to determine measured ion flux of ions within the plasma chamber, wherein the controller is configured to determine whether the measured ion flux matches a predetermined ion flux,
wherein the controller includes a processor and a memory device,
wherein the processor is configured to access a predetermined variable value from the memory device based on a correspondence between the predetermined variable value and the predetermined ion flux,
wherein the controller is configured to provide the predetermined variable value to the variable adjuster,
wherein the variable adjuster is configured to adjust the variable of the $(n+2)^{th}$ harmonic RF signal to achieve the predetermined variable value to further achieve the predetermined ion flux.

19. The system of claim 15, wherein the $(n+2)^{th}$ harmonic RF signal is a third harmonic signal, wherein the variable is an amplitude of the third harmonic signal.

20. The system of claim 15, wherein the first impedance matching circuit is configured to match an impedance of a load coupled to the first impedance matching circuit with that of a source coupled to the first impedance matching circuit to output the $n^{th}$ modified harmonic RF signal, wherein the second impedance matching circuit is configured to match an impedance of a load coupled to the second impedance matching circuit with that of a source coupled to the second impedance matching circuit to output the $(n+2)^{th}$ modified harmonic RF signal, wherein the plasma chamber is coupled to the adder via an RF transmission line.

* * * * *